United States Patent
Tanaka et al.

(10) Patent No.: US 9,751,267 B2
(45) Date of Patent: Sep. 5, 2017

(54) OPTICAL ELEMENT, LIGHT-EMITTING DEVICE, LIGHTING DEVICE, AND METHOD FOR MANUFACTURING OPTICAL ELEMENT

(75) Inventors: Koichiro Tanaka, Kanagawa (JP); Katsuki Yanagawa, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 537 days.

(21) Appl. No.: 13/371,418

(22) Filed: Feb. 11, 2012

(65) Prior Publication Data
US 2012/0206923 A1    Aug. 16, 2012

(30) Foreign Application Priority Data

Feb. 14, 2011   (JP) ................. 2011-029181

(51) Int. Cl.
| | | |
|---|---|---|
| *F21V 5/00* | (2015.01) | |
| *G02B 5/02* | (2006.01) | |
| *H01L 51/52* | (2006.01) | |
| *B29D 11/00* | (2006.01) | |
| *B29C 44/04* | (2006.01) | |

(52) U.S. Cl.
CPC .... *B29D 11/00009* (2013.01); *B29C 44/0438* (2013.01); *G02B 5/0215* (2013.01); *G02B 5/0231* (2013.01); *G02B 5/0247* (2013.01); *G02B 5/0278* (2013.01); *H01L 51/5268* (2013.01); *H01L 51/5275* (2013.01)

(58) Field of Classification Search
CPC ......... G02F 1/133606; G02F 1/133611; G02F 1/133504; G02B 5/0242; G02B 5/0247; G02B 5/0263; G02B 6/0065; G02B 6/0061; G02B 6/0036

USPC ............... 362/326, 332, 331, 330, 335, 336; 359/599, 707, 832
See application file for complete search history.

(56) References Cited

U.S. PATENT DOCUMENTS

| | | | |
|---|---|---|---|
| 5,003,221 A | 3/1991 | Shimizu | |
| 5,869,929 A | 2/1999 | Eida et al. | |
| 6,157,426 A | 12/2000 | Gu | |
| 6,399,222 B2 | 6/2002 | Arai et al. | |
| 6,623,862 B2 | 9/2003 | Choi et al. | |
| 6,632,708 B2 | 10/2003 | Sakama et al. | |

(Continued)

FOREIGN PATENT DOCUMENTS

| | | |
|---|---|---|
| EP | 2 141 962 A1 | 1/2010 |
| EP | 2 219 416 A1 | 8/2010 |

(Continued)

OTHER PUBLICATIONS

Machine translation of JP 2009020331A to Sakai, Natsuka, published Jan. 29, 2009.*

(Continued)

*Primary Examiner* — Peggy Neils
*Assistant Examiner* — William N Harris
(74) *Attorney, Agent, or Firm* — Husch Blackwell LLP

(57) ABSTRACT

An optical element comprises an organic resin and bubbles distributed to have a number density increasing from a first plane of the optical element toward a second plane of the optical element, where a diameter of the bubbles is less than or equal to a wavelength of light which enters the optical element. At least one of the first plane and the second plane may have an uneven structure.

46 Claims, 9 Drawing Sheets

(56) References Cited

U.S. PATENT DOCUMENTS

| | | | |
|---|---|---|---|
| 6,673,659 B2 | 1/2004 | Sakama et al. | |
| 6,689,492 B1 | 2/2004 | Yamazaki et al. | |
| 6,818,328 B2 | 11/2004 | Utsumi et al. | |
| 6,894,431 B2 | 5/2005 | Yamazaki et al. | |
| 7,211,838 B2 | 5/2007 | Miyazawa | |
| 7,242,375 B2 | 7/2007 | Hayashi et al. | |
| 7,830,086 B2 | 11/2010 | Adachi et al. | |
| 7,872,414 B2 | 1/2011 | Sugita et al. | |
| 8,013,328 B2 | 9/2011 | Burroughes et al. | |
| 8,089,208 B2 | 1/2012 | Yamada et al. | |
| 8,283,845 B2 | 10/2012 | Itou et al. | |
| 8,287,158 B2 * | 10/2012 | Hwang | 362/311.01 |
| 8,415,695 B2 * | 4/2013 | Lenk | 257/98 |
| 8,431,943 B2 * | 4/2013 | Nakamura | H01L 51/5268 257/40 |
| 8,455,884 B2 | 6/2013 | Ikeda et al. | |
| 8,496,341 B2 | 7/2013 | Kawata et al. | |
| 9,052,543 B2 * | 6/2015 | Jeong | G02F 1/133606 |
| 9,116,382 B2 * | 8/2015 | Seo | G02B 6/0036 |
| 2001/0016262 A1 | 8/2001 | Toyoshima et al. | |
| 2004/0008968 A1 | 1/2004 | Lee et al. | |
| 2004/0119400 A1 * | 6/2004 | Takahashi et al. | 313/504 |
| 2006/0158109 A1 | 7/2006 | Takahashi et al. | |
| 2008/0117630 A1 * | 5/2008 | Durvasula et al. | 362/246 |
| 2011/0317096 A1 * | 12/2011 | Yokota et al. | 349/64 |
| 2012/0012877 A1 * | 1/2012 | Bawendi et al. | 257/98 |
| 2015/0151561 A1 * | 6/2015 | Toda | G02B 5/0221 359/567 |

FOREIGN PATENT DOCUMENTS

| | | |
|---|---|---|
| EP | 2 224 788 A1 | 9/2010 |
| JP | 07-211458 A | 8/1995 |
| JP | 2001-284040 A | 10/2001 |
| JP | 2002-359070 A | 12/2002 |
| JP | 2005-251488 A | 9/2005 |
| JP | 2006-164808 A | 6/2006 |
| JP | 2009-004274 A | 1/2009 |
| JP | 2009-20331 | 1/2009 |
| JP | 2009020331 A * | 1/2009 |
| JP | 2010-212204 A | 9/2010 |
| JP | 2010-277983 A | 12/2010 |
| JP | 2011-009229 A | 1/2011 |
| WO | WO 2007/105671 A1 | 9/2007 |
| WO | WO 2008/122780 A2 | 10/2008 |
| WO | WO 2009/060916 A1 | 5/2009 |
| WO | WO 2010126007 A1 * | 11/2010 |

OTHER PUBLICATIONS

Tang, C.W. et al., "Organic Electroluminescent Diodes," Applied Physics Letters, Sep. 21, 1987, vol. 51, No. 12, pp. 913-915.

Adachi, C. et al., "Electroluminescence in Organic Films With Three-Layer Structure," Japanese Journal of Applied Physics, Feb. 20, 1988, vol. 27, No. 2, pp. L269-L271.

* cited by examiner

FIG. 5A1
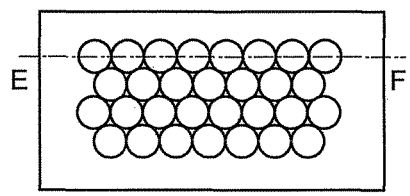
FIG. 5A2
FIG. 5B1
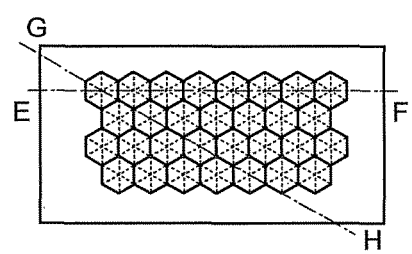
FIG. 5B2
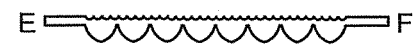
FIG. 5B3
FIG. 5C1
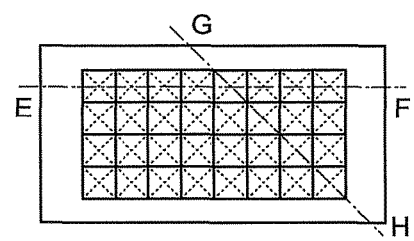
FIG. 5C2
FIG. 5C3
FIG. 5D1
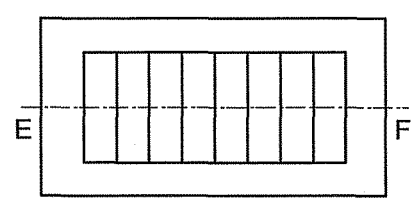
FIG. 5D2

FIG. 6A1
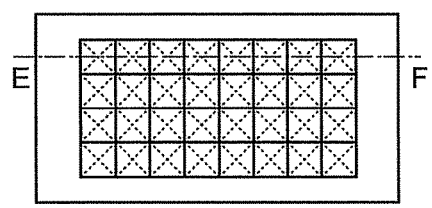
FIG. 6A2
FIG. 6B1
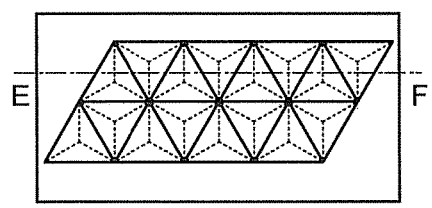
FIG. 6B2
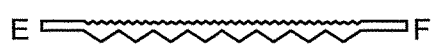
FIG. 6C1
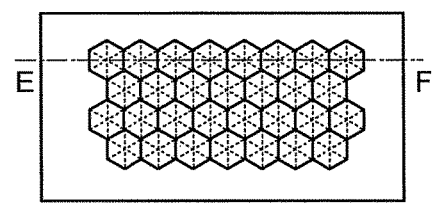
FIG. 6C2
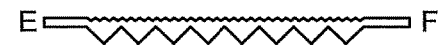
FIG. 6D1
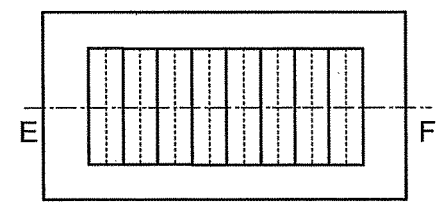
FIG. 6D2

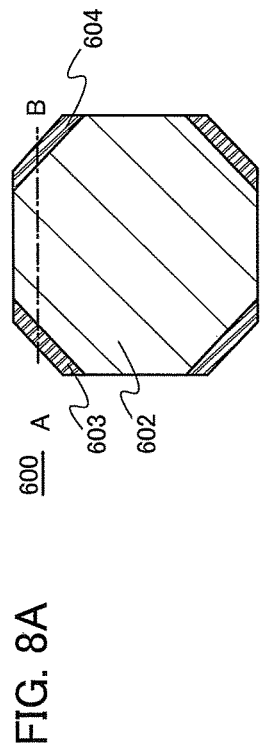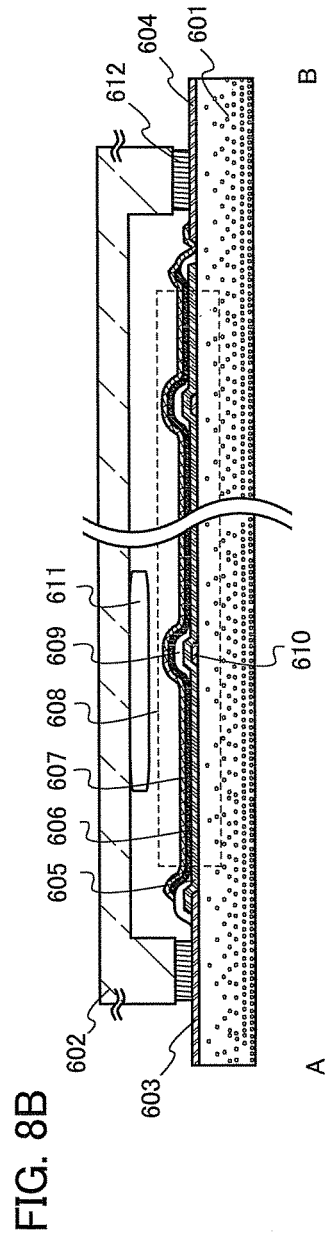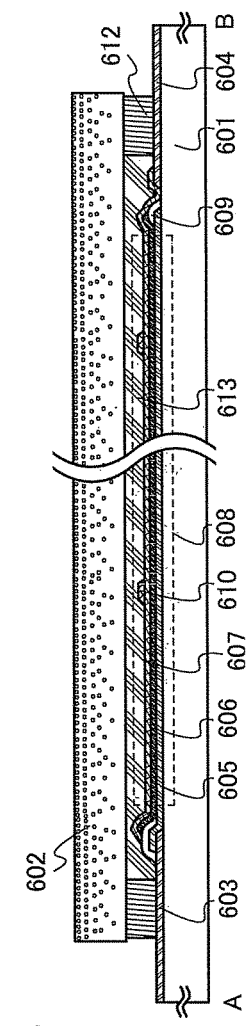
FIG. 8A
FIG. 8B
FIG. 8C

OPTICAL ELEMENT, LIGHT-EMITTING DEVICE, LIGHTING DEVICE, AND METHOD FOR MANUFACTURING OPTICAL ELEMENT

BACKGROUND OF THE INVENTION

1. Field of the Invention

The present invention relates to an optical element which is used for a solid-state light-emitting element utilizing electroluminescence (EL) and to a light-emitting device including the optical element. The present invention also relates to a lighting device including the light-emitting device. In addition, the present invention relates to a method for manufacturing the optical element.

2. Description of the Related Art

An organic EL element which is an example of the solid-state light-emitting element (also referred to as a light-emitting element) has been actively researched and developed. In the fundamental structure of an organic EL element, a light-emitting organic compound is sandwiched between a pair of electrodes. By applying voltage to this element, light emission from the light-emitting organic compound can be obtained.

The organic EL element can be formed into a film shape and thus a large-area element can be easily formed. Therefore, utility value of the organic EL element as a planar light source that can be applied to lighting or the like is also high.

As described above, application of an organic EL element to light-emitting devices, lighting devices, or the like is expected. In Patent Document 1, an organic optical device including an organic thin film transistor and an organic EL element is disclosed.

REFERENCE

Patent Document

[Patent Document 1] International Publication WO 2008/122780

In a solid-state light-emitting element, light is emitted in a region having a higher refractive index than the air; thus, a significant light loss due to reflection is caused at a refractive index interface before light is extracted to the air. Further, there is a condition under which total reflection occurs when light proceeds from a region having a high refractive index to a region having a low refractive index. Therefore, the light extraction efficiency of a solid-state light-emitting element does not reach 100%.

SUMMARY OF THE INVENTION

The present invention is made in view of the foregoing technical background. Accordingly, an object is to provide an optical element which can efficiently extract light from a region having a high refractive index to a region having a low refractive index. Further, an object is to provide a light-emitting device including the optical element. In addition, an object is to provide a highly efficient lighting device including the light-emitting device. Furthermore, an object is to provide a method for manufacturing the optical element.

In order to achieve the above objects, the present inventors conceived a structure in which, between a solid-state light-emitting element having a high refractive index and the air having a low refractive index, an optical element whose refractive index continuously decreases from the solid-state light-emitting element toward the air is provided. In the case where the refractive index continuously decreases from the solid-state light-emitting element toward the air, reflection can be suppressed as compared to the case where light emitted by the solid-state light-emitting element is directly extracted to the air, and improved light extraction efficiency can be obtained.

The optical element whose refractive index continuously decreases from the solid-state light-emitting element toward the air can be manufactured by injection of bubbles into a medium. Specifically, distribution of the bubbles is such that the number density of the bubbles gradually increases from a side of the optical element on which the solid-state light-emitting element is provided toward a light emission plane of the optical element, whereby an apparent refractive index of the optical element continuously decreases from the side on which the solid-state light-emitting element is provided toward the light emission plane of the optical element.

Here, the apparent refractive index of the optical element, refers to a composite refractive index of the medium and the bubble which are included in a portion of the optical element. The composite refractive index is determined by the refractive indices and a volume ratio of the bubbles and the medium which are included in part of the optical element.

With the above-described structure, reflection that would be caused at an interface between the solid-state light-emitting element and the air can be prevented to improve light extraction efficiency. Further, since bubbles are used to vary the refractive index in the optical element, the refractive index continuously decreases from the solid-state light-emitting element toward the air, so that a refractive index interface becomes unclear. Therefore, it can be considered that reflection due to the refractive index variation hardly occurs in the optical element. Accordingly, light loss due to reflection can be suppressed when the light, which is extracted from a region having a high refractive index to a region having a low refractive index, is transmitted through the optical element.

Thus, one embodiment of the present invention is an optical element which light having a wavelength from the ultraviolet to infrared enters. The optical element includes a medium containing bubbles, a plane of the optical element which light enters serves as a light incident plane, and the other plane serves as a light emission plane. The bubbles are distributed so as to have a number density increasing in a direction of the light from the light incident plane to the light emission plane in the medium. The diameter of the bubble is less than or equal to the wavelength of the light which enters the optical element, preferably greater than or equal to 10 nm and less than or equal to 10 μm.

The optical element according to one embodiment of the present invention includes the base in which the bubbles are distributed so that the number density of the bubbles increases from the light incident plane toward the light emission plane. Thus, an apparent refractive index of the optical element is determined by a composite refractive index of the medium and the bubbles which are included in the optical element. From the light incident plane toward the light emission plane, the apparent refractive index of the optical element decreases from the refractive index of the light-emitting element so as to gradually approach the refractive index of the air. Therefore, at the time of extraction of light from a light-emitting region of the solid-state light-emitting element which has a high refractive index to the air which has a low refractive index, light extraction efficiency of a light-emitting device can be improved because there is no interface which includes a large refractive index difference and reflection can be suppressed.

The diameter of the bubble here is less than or equal to the wavelength of the light which enters the optical element, and the size of the bubble is such that the bubble does not cause refraction or reflection of the light when the light proceeds in the medium. As the number density of the bubbles increases, the ratio of the air in the medium increases, and the apparent refractive index of the optical element decreases.

Further, in the optical element according to one embodiment of the present invention, the light emission plane preferably has a refractive index greater than 1.0 and less than 1.1. When a refractive index at an interface with the air (the light emission plane) is closer to the refractive index of the air, i.e., 1.0, light reflection at the time of light extraction to the air is more suppressed, so that an optical element which is capable of efficiently extracting the light from the solid-state light-emitting element can be provided.

In the optical element according to one embodiment of the present invention, the light incident plane preferably has an uneven structure. Such a structure can prevent part of light emitted from the solid-state light-emitting element from being totally reflected repeatedly at an interface between the solid-state light-emitting element and the optical element, and the light can be extracted to the optical element. Thus, a reduction in light extraction efficiency can be suppressed.

In the optical element according to one embodiment of the present invention, the light emission plane preferably has an uneven structure. With such a structure, a phenomenon can be suppressed in which total reflection of light which enters the air from the optical element at an angle exceeding the critical angle is repeated, the light propagates inside the optical element, and the light extraction efficiency is reduced. Further, the uneven structure is preferably a hemispherical structure. It is preferable that the refractive index of the hemispherical structure concentrically decrease from the center of the hemisphere toward the outside. The concentric decrease in the refractive index means that the refractive index continuously decreases in a direction in which the light proceeds; thus, the light extraction efficiency of a light-emitting device can be further improved.

Another embodiment of the present invention is a light-emitting device that includes the above optical element and a solid-state light-emitting element over the light incident plane of the optical element. When provided with the optical element capable of improving light extraction efficiency, the light-emitting device can have high light extraction efficiency.

Still another embodiment of the present invention is the light-emitting device in which an organic electroluminescence element is used as the solid-state light-emitting element.

Yet still another embodiment of the present invention is a lighting device which includes the above light-emitting device.

A method for manufacturing an optical element for a light-emitting element, which is yet still another embodiment of the present invention, includes the following first to sixth steps: the first step in which the medium is poured between a pair of molds and pressure is applied to the medium between the pair of molds by pressing the pair of molds against each other while the pair of molds are heated, so that the medium is shaped into a desired shape; the second step in which a bubble is injected from below the medium in a first cycle with the medium kept at a temperature higher than or equal to a softening point; the third step in which the mold over the medium is cooled; the fourth step in which a bubble is injected from below the medium in a second cycle longer than the first cycle so that the bubble in the medium is distributed continuously; the fifth step in which injection of the bubble from below the medium is stopped; and the sixth step in which the mold below the medium is cooled.

When the above-described manufacturing method is employed, an optical element in which the number density of the injected bubbles continuously varies can be easily manufactured.

Note that the ordinal numbers such as "first" and "second" in this specification are used for convenience to distinguish components and do not denote the order of steps or the stacking order of layers. In addition, the ordinal numbers in this specification do not denote particular names which specify the present invention.

Note that in this specification, in some cases, the term "refractive index" refers to a composite refractive index of a structure where bubbles are distributed in a resin, for example, which is determined by the volume ratio of the resin and the bubbles in a portion of the structure, or an apparent refractive index, as well as the original refractive index of a substance.

Note that in this specification, a plane of an optical element does not strictly refer to a plane without a thickness but has some, thickness and some volume in some cases.

According to one embodiment of the present invention, it is possible to provide the following: an optical element which can efficiently extract light from a region having a high refractive index to a region having a low refractive index; a light-emitting device which includes the optical element; a highly efficient lighting device which includes the light-emitting device; or a method for manufacturing the optical element.

BRIEF DESCRIPTION OF THE DRAWINGS

In the accompanying drawings:

FIGS. 5A-1, 5A-2, 5B-1, 5B-2, 5B-3, 5C-1, 5C-2, 5C-3, 5D-1, and 5D-2 each illustrate an optical element used in a light-emitting device according to one embodiment of the present invention;

FIGS. 6A-1, 6A-2, 6B-1, 6B-2, 6C-1, 6C-2, 6D-1, and 6D-2 each illustrate an optical element used in a light-emitting device according to one embodiment of the present invention;

FIGS. 8A to 8C illustrate light-emitting devices according to one embodiment of the present invention.

DETAILED DESCRIPTION OF THE INVENTION

Figure 1A:
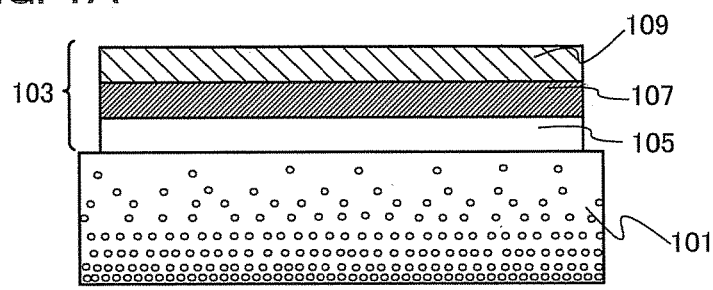
FIGS. 1A and 1B illustrate a light-emitting device and an optical element according to one embodiment of the present invention, respectively.

Embodiments of the present invention will be described in detail below with reference to the accompanying drawings.

Note that the invention is not limited to the description below, and it is easily understood by those skilled in the art that various changes and modifications can be made without departing from the spirit and scope of the invention. Therefore, the present invention should not be construed as being limited to the following description of the embodiments. Note that in the structures of the present invention described below, the same portions or portions having similar functions are denoted by the same reference numerals in different drawings, and description of such portions is not repeated.

(Embodiment 1)

In this embodiment, an optical element according to one embodiment of the present invention and a light-emitting device including the optical element are described with reference to FIGS. 1A and 1B and FIGS. 2A to 2C.

As illustrated in FIG. 1A, an optical element 101 has one plane which is in contact with a solid-state light-emitting element 103 and the other plane which is in contact with the air.

The solid-state light-emitting element 103 includes a transparent electrode 105 which is in contact with the optical element 101, a light-emitting region 107 provided over the transparent electrode 105 and emitting light toward the transparent electrode 105, and a reflective electrode 109 provided over the light-emitting region 107.

As examples of the solid-state light-emitting element 103, an organic EL element, an inorganic EL element, and an LED can be given. The shape of the solid-state light-emitting element is not particularly limited and may be circular instead of polygonal. Note that detailed description of a solid-state light-emitting element will be given in a later embodiment. Although the solid-state light-emitting element can be expected to have high reliability, a structure for efficiently extracting light to the air is needed because light is generated in a region whose refractive index is higher than that of the air.

When being transmitted through media having different refractive indices, light is reflected at an interface between the media and it is difficult to completely extract the light. There is a condition under which light from a region having a high refractive index to a region having a low refractive index is totally reflected at an interface therebetween and cannot be extracted.

Total reflection of light occurs in the case where an incident angle of the light exceeds the critical angle, which is determined by the refractive indices of the media. As a refractive index difference between a medium from which light is emitted and a medium which the light enters becomes larger, the critical angle becomes smaller, total reflection more easily occurs, and a larger amount of light is reflected.

While the refractive index of the air is approximately 1.0, a general refractive index of a light-emitting region of a solid-state light-emitting element is approximately 1.6 to 1.7. A general refractive index of a transparent electrode, which is provided on a side to which a solid-state light-emitting element emits light, is approximately 1.7 to 2.2. Accordingly, in the case of extraction of light emitted by a solid-state light-emitting element to the air through a transparent electrode, a large amount of light cannot be extracted as a result of reflection or total reflection and light extraction efficiency is low.

Thus, an optical element according to one embodiment of the present invention is provided between a solid-state light-emitting element and the air, whereby reflection at a refractive index interface is suppressed and light extraction efficiency is improved. Note that in the following description, the term "reflection" refers to a phenomenon of a failure in light extraction at a refractive index interface, which includes total reflection, in a broad sense. Further, the term "optical element" in this specification refers to an element through which light is transmitted or from which incident light is emitted in a changed direction; specific examples of an optical element are a light-transmitting substrate, a lens, and a microlens array.

The optical element 101 is formed using a material which transmits visible light. The optical element 101 can be formed using any of the following materials, for example: an organic resin such as a polyester resin, a polyacrylonitrile resin, a polyimide resin, a polymethyl methacrylate resin, a polycarbonate resin, a polyether sulfonate resin, a polyamide resin, a cycloolefin resin, a polystyrene resin, or a polyvinyl chloride resin; glass; indium oxide; indium tin oxide (ITO); indium zinc oxide; zinc oxide; zinc oxide to which gallium is added; and graphene. A resin having a high refractive index is preferably used for the optical element 101, because, in such a case, a refractive index difference at an interface with the solid-state light-emitting element can be small and reflection at the interface with the solid-state light-emitting element can be suppressed.

In the optical element 101, bubbles are distributed so that the number density of the bubbles increases from the one plane which is in contact with the solid-state light-emitting element 103 toward the other plane which is in contact with the air.

Although the refractive index of the above-mentioned organic resin is approximately 1.5 to 1.6, an apparent refractive index of the optical element according to one embodiment of the present invention is determined by a volume ratio of the bubbles distributed in the organic resin. An apparent refractive index of a portion of the optical element refers to a composite refractive index which is determined by the refractive index of the organic resin and a volume ratio of the bubbles included in the organic resin. As the volume ratio of the bubbles included in the organic resin increases, the composite refractive index decreases to approach the refractive index of the air.

In the optical element 101, the bubbles are distributed so that the number density of the bubbles increases from the one plane which is in contact with the solid-state light-emitting element toward the other plane which is in contact with the air. Therefore, the composite refractive index of the organic resin and the bubbles in the optical element 101 gradually decreases from the light incident plane toward the light emission plane of the optical element.

In the optical element, the refractive index continuously varies, so that a refractive index difference at the interface with the air becomes small; as a result, reflection at the time of extraction of light to the air is suppressed, and light extraction efficiency is improved.

Figure 1B:
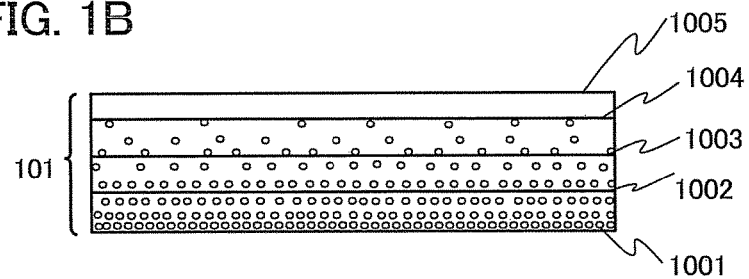

The optical element 101 of this embodiment is described. The optical element 101 has a refractive index which continuously decreases from the plane (light incident plane) being in contact with the light-emitting element toward the plane (light emission plane) being in contact with the air. Here, the variation in the refractive index in the optical element will be described referring to five planes parallel to the solid-state light-emitting element. In FIG. 1B, the planes of the optical element are schematically illustrated.

The optical element 101 illustrated in FIG. 1B includes a first plane 1001 that is the light emission plane, a fifth plane 1005 that is the light incident plane, and a second plane 1002, a third plane 1003, and a fourth plane 1004 which are interposed between the first plane 1001 and the fifth plane 1005.

The planes of the optical element are different from each other in the number density of the distributed bubbles therein so that the refractive index increases from the first plane 1001 toward the fifth plane 1005. How light proceeds in the optical element 101 will be described referring to each plane in the optical element 101. In the fifth plane 1005 which is in contact with the solid-state light-emitting element 103 and is the light incident plane, the number of the distributed bubbles is the smallest, and thus, an apparent refractive index is the highest. The fifth plane 1005 is the plane which light emitted by the solid-state light-emitting element 103 having a high refractive index enters. Therefore, the fifth plane 1005 preferably has a high refractive index which is as close as possible to that of the solid-state light-emitting element so that a refractive index difference with the solid-state light-emitting element 103 is as small as possible.

Accordingly, it is preferable that no bubbles be injected into the fifth plane 1005 and the refractive index of the fifth plane 1005 be equal to that of the organic resin used for the optical element. The refractive index $n_{org}$ of the organic resin used for the optical element of this embodiment is 1.5. Since no bubbles are included in the fifth plane 1005, the refractive index of the fifth plane 1005 is 1.5.

When the refractive index difference between the solid-state light-emitting element 103 and the fifth plane 1005 of the optical element 101 which is in contact with the solid-state light-emitting element 103 is small, reflection at the interface when light from the solid-state light-emitting element 103 enters the optical element 101 is suppressed, and thus, the light can efficiently enter the optical element 101.

After being transmitted through the fifth plane 1005, the light from the solid-state light-emitting element 103 is transmitted through the fourth plane 1004. The fourth plane 1004 has a lower refractive index than the fifth plane 1005. The fourth plane 1004 is formed using the same organic resin as the fifth plane 1005 but distribution of the bubbles in the fourth plane 1004 is such that the fourth plane 1004 has a higher number density of bubbles than the fifth plane 1005. Therefore, the fourth plane 1004 has a lower apparent refractive index than the fifth plane 1005 due to a composite refractive index of the organic resin and the distributed bubbles.

A refractive index difference between the fifth plane 1005 and the fourth plane 1004 can be appropriately set in consideration of the refractive index of the solid-state light-emitting element, the refractive index of the organic resin used for the optical element, a distance between the fifth and fourth planes, or the like.

When the optical element is assumed to include N planes (N is a natural number of 2 or more) which have different refractive indices in a path through which light is transmitted, a plane which is in contact with the air is regarded as a first plane, and planes adjacent to the first plane are a second plane, a third plane, and the like in this order from the first plane side. The refractive index $n_k$ of the k-th plane (k is a natural number) preferably satisfies a formula (1) below. In the formula (1), $n_{org}$ represents the refractive index of the organic resin, and the refractive index of the air included in the bubble is 1.0. Further, k is a natural number greater than or equal to 2 and less than or equal to N ($2 \leq k \leq N$).

[FORMULA 1]

$$\frac{N + (k-1)(n_{org} - 1.0)}{N} \leq n_k \leq \frac{N + k(n_{org} - 1.0)}{N} \quad (1)$$

When the formula (1) is satisfied, the planes of the optical element 101 have a refractive index decreasing from the plane which is in contact with the solid-state light-emitting element toward the plane which is in contact with the air. Further, any two adjacent planes of the optical element have substantially the same refractive index difference therebetween, which indicates that the refractive index varies from one plane to the adjacent plane at regular intervals. Thus, the refractive indices of the planes in the organic resin member continuously decrease from the solid-state light-emitting element toward the air and total reflection is suppressed, whereby light extraction efficiency is improved.

Note that in this embodiment, description of the optical element is provided referring to five planes which have different refractive indices; however, the number N of the planes which have different refractive indices of the optical element is much larger than five. Ideally, when bubbles are so uniformly distributed in each plane that N can be regarded as ∞, a refractive index difference between the planes becomes small, and reflection is thus suppressed.

In addition, the use of the plurality of planes of the optical element, which have different refractive indices, is just for simple explanation; actually, the number densities of the bubbles included in the plurality of planes of the optical element are continuously distributed and an interface between the planes is unclear. Therefore, reflection hardly occurs at an interface between the planes, so that light proceeds with substantially no loss at the planes in the optical element. Since light extraction is performed with a refractive index interface being unclear and with the refractive index gradually varying from the refractive index of the light-emitting element to the refractive index of the air, an optical element according to one embodiment of the present invention can improve light extraction efficiency.

Next, a composite refractive index of the organic resin and the bubbles in each plane is described.

The refractive index $n_k$ of the k-th plane of the organic resin member is represented by a formula (2) below. Here, $V_{ak}$, $V_{bk}$, and $n_{org}$ respectively represent a volume ratio of the bubbles included in the k-th plane, a volume ratio of the organic resin included in the k-th plane, and the refractive index of the organic resin. Note that $V_{ak}+V_{bk}=1$. The refractive index of the bubble included in the organic resin member is regarded as 1.0.

[Formula 2]

$$V_{ak}+n_{org}V_{bk}=n_k \quad (2)$$

The volume ratio of the organic resin and the bubbles is preferably adjusted with the use of the formula (2) so that each plane has a desired refractive index. For example, in this embodiment, the volume ratio of the bubbles included in the fourth plane is determined with the use of the formula (2) so that the refractive index $n_4$ of the fourth plane 1004 is 1.4. Since the refractive index $n_{org}$ of the organic resin is 1.5, the volume ratio $V_{a4}$ of the bubbles included in the fourth plane 1004 is 0.2.

Further, from the formula (2), in order that the refractive index $n_k$ of a plane satisfy the formula (1), the volume ratio of the organic resin and the bubbles of the plane preferably satisfies a formula (3) below.

[FORMULA 3]

$$\frac{N+(k-1)(n_{org}-1.0)}{N} \leq V_{ak} + n_{org}V_{bk} \leq \frac{N+k(n_{org}-1.0)}{N} \quad (3)$$

The volumes of the organic resin and the bubbles of each plane are preferably adjusted in such a manner that the formula (3) is satisfied and a refractive index difference between planes becomes small.

Light transmitted through the fourth plane 1004 in the optical element 101 subsequently enters the third plane 1003 and the second plane 1002.

More bubbles are distributed in the third plane 1003 than in the fourth plane 1004, and the third plane 1003 has a low apparent refractive index. When a volume ratio of the bubbles is adjusted so that the third plane 1003 satisfies the formula (3) and a refractive index difference between the planes is made small, light extraction efficiency is improved. In this embodiment, the refractive index $n_3$ of the third plane 1003 is 1.3, and a volume ratio $V_{a3}$ of the bubbles included in the third plane 1003 is 0.4.

The second plane 1002 includes more bubbles, so that the second plane 1002 has a lower refractive index. In this embodiment, the refractive index $n_2$ of the second plane 1002 is 1.2, and a volume ratio $V_{a2}$ of the bubbles included in the second plane 1002 is 0.6.

The first plane 1001 is an interface with the air and is the light emission plane. The refractive index $n_1$ of the first plane 1001 which is in contact with the air is preferably greater than 1.0 and less than 1.1. This is to improve light extraction efficiency in such a manner that, in such a case, a refractive index difference between the air having a refractive index of 1.0 and the first plane 1001 is reduced to suppress reflection at the interface between the first plane 1001 and the air.

In this embodiment, the refractive index $n_1$ of the first plane 1001 is 1.1, and a volume ratio $V_{a1}$ of the bubbles included in the first plane 1001 is 0.8.

When the planes have a continuously varying refractive index as described above, reflection at the interface with the air is suppressed and light extraction efficiency is improved. Further, since light is not reflected between the planes in the optical element, light extraction efficiency is improved.

A pore may be formed on the surface of the first plane which is in contact with the air. Such pores which are generated due to the bubbles do not influence light extraction of the optical element because the diameter of the bubble is sufficiently small as compared to the size of the organic resin member.

The diameter of the bubble inside the optical element is preferably as small as possible, and a preferable diameter of the bubble is less than or equal to the wavelength of the light. Further, the bubbles are preferably distributed uniformly in a plane. Since light from the solid-state light-emitting element is diffused, the light proceeds in various directions. When the bubbles are distributed uniformly in a plane, light proceeding in any direction can be extracted to the air without being reflected or totally reflected; thus, the light extraction efficiency can be improved.

Although the thickness of each plane is not particularly limited, it is preferably 100 μm or less. The thickness of one plane may be the same as or different from that of the other plane.

As described above, the refractive index decreases from the plane which is in contact with the solid-state light-emitting element toward the plane which is in contact with the air, whereby light loss at the time of extraction of light emitted by the solid-state light-emitting element, which is due to reflection, is suppressed; thus, light extraction efficiency can be improved.

The light-emitting device described in this embodiment extracts light emitted by the solid-state light-emitting element to the air through the optical element whose refractive index continuously decreases from the solid-state light-emitting element toward the air because of the bubbles included in the optical element. Owing to the included bubbles, the refractive index gradually varies, whereby light reflection in the light-emitting device described in this embodiment is suppressed, and the light-emitting device has high light extraction efficiency.

Thus, an optical element which can efficiently extract light from a region having a high refractive index to a region having a low refractive index can be provided.

<Modification Example>

A modification example of the light-emitting device of this embodiment is described.

The optical element of this embodiment may have an uneven structure at the light emission plane.

Figure 2A:
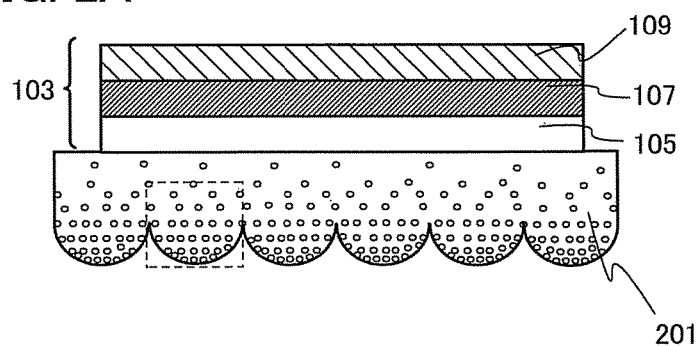
FIGS. 2A to 2C illustrate light-emitting devices according to one embodiment of the present invention.
Figure 2B:
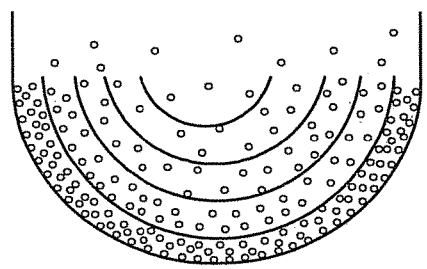
Figure 2C:
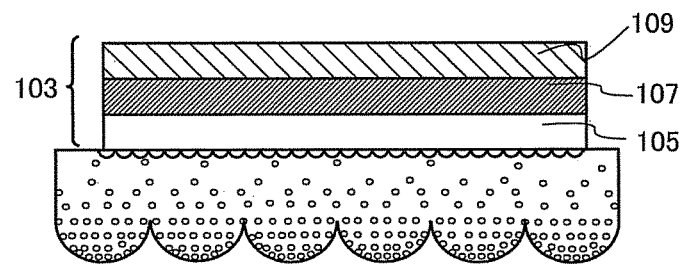

In FIGS. 2A to 2C, an optical element which has an uneven structure at a light emission plane is illustrated. FIG. 2A is a cross-sectional view, of a light-emitting device whose optical element has a hemispherical structure, and FIG. 2B is an enlarged view of a portion of the hemispherical structure illustrated in FIG. 2A which is surrounded by a dotted line.

As illustrated in FIG. 2A, in an optical element 201, distribution of bubbles is such that the number density of the bubbles increases from a plane (light incident plane) which is in contact with the solid-state light-emitting element 103 toward a plane (light emission plane) which is in contact with the air, and an apparent refractive index decreases from the light incident plane toward the light emission plane.

The light emission plane of the optical element 201 has the hemispherical structure. When the optical element 201 has the hemispherical structure, a phenomenon can be suppressed in which light from the optical element 201 which enters the air at an angle exceeding the critical angle is totally reflected and propagates inside the optical element 201 and the light extraction efficiency is reduced. Thus, extraction efficiency of the incident light can be further increased.

As the uneven structure, a hemispherical structure, a circular cone, or a pyramid such as a three-sided pyramid, a four-sided pyramid, or a six-sided pyramid can be employed, for example. A bottom surface of the uneven structure is preferably triangular, square, or hexagonal, because, in such a case, an area ratio of the bottom surfaces of the uneven structures to the light emission plane can be high. As the area ratio thereof is higher, a condition under which light emitted by the solid-state light-emitting element is totally reflected is less likely to be fulfilled and light extraction efficiency is increased. Therefore, a figure which allows the area ratio thereof to be high is preferably employed.

As the uneven structure, the hemispherical structure is provided to the optical element 201. A hemispherical structure includes an arc in a cross-section passing through a peak of the hemispherical structure. For example, one mode of the hemispherical structure is a structure whose base is circular and whose cross section passing through a peak of the structure is semicircular. Another mode of the hemispherical structure is a structure (which can be referred to as an umbrella-like structure) whose base is polygonal and whose cross section passing through a peak of the structure includes an arc (e.g., a semicircle). A hemispherical structure whose base is a polygon with many angles is substantially the same as a hemispherical structure whose base is circular.

Note that a light-emitting device may be formed by arrangement of uneven structures varying in shape and size. For example, a small hemispherical structure is provided in a space between adjacent larger hemispherical structures, in which case light extraction efficiency can be increased.

In addition, some of the uneven structures may have a flat portion or the like due to a slight error in design. A shape capable of suppressing total reflection as much as possible between the uneven structure and the air can be employed.

The diameter of the uneven structure of the light emission plane is approximately 0.1 mm to 10 mm. Further, the uneven structure of the light emission plane may be provided in only a portion overlapping with the light-emitting region of the light-emitting element or in the entire plane of the optical element.

Further, in the case where the uneven structure is a hemispherical structure, as illustrated in FIG. 2B, distribution of the bubbles is preferably such that the number density of the bubbles concentrically increases from the center toward the outside.

Here, the term "concentrically" means a situation where concentric circles are formed with a circle in a cross-section of the hemispherical structure which is parallel or perpendicular to the light-emitting element. The number density of the bubbles concentrically increases, whereby the refractive index of the hemispherical structure concentrically decreases from the center of the hemisphere. The concentric decrease from the center means that the refractive index decreases along a direction in which light proceeds in the optical element; thus, light reflection at interfaces in the optical element is suppressed, so that light extraction efficiency is improved.

Distribution of the bubbles in the uneven structure is not limited by the above description and a structure in which the number density of bubbles is the highest in the furthest plane from the solid-state light-emitting element may be employed.

In another modification example, the optical element of this embodiment may have an uneven structure at the light incident plane. Such a structure can prevent part of light emitted from the solid-state light-emitting element from being totally reflected repeatedly at an interface between the solid-state light-emitting element and the optical element, and the light can be extracted to the optical element. Alternatively, both the light incident plane and the light emission plane may have uneven structures. FIG. 2C illustrates a structure in which both the light incident plane and the light emission plane have uneven structures.

The uneven structure of the light incident plane may have a regular form or an irregular form. Further, the uneven structure and an uneven structure of an adjacent solid-state light-emitting element may be continuous or discontinuous with each other. Although the uneven structure of the light incident plane arranged in a striped form is effective, an uneven structure arranged in a matrix is preferable.

Further, the uneven structure of the light incident plane is preferably provided with a layer which planarizes an upper portion of the uneven structure, because, in such a case, the transparent electrode can be formed flat even when the solid-state light-emitting element is an organic EL element, and leakage current in the organic EL element due to unevenness of the transparent electrode can be suppressed, which leads high reliability.

A distance from a valley to a peak of the uneven structure of the light incident plane may be approximately 0.1 μm to 100 μm. It is preferable that the distance be 1 μm or more, because, in such a case, influence due to interference of light can be suppressed. Moreover, it is preferable that a distance between adjacent peaks be approximately 1 μm to 100 μm. Provision of the uneven structure to the light incident plane makes it unnecessary to use an expensive material with a high refractive index in formation of the hemispherical structure of the light emission plane, which facilitates manufacture.

As the uneven structure, a hemispherical structure, a circular cone, or a pyramid such as a three-sided pyramid, a four-sided pyramid, or a six-sided pyramid can be employed, for example. A bottom surface of the uneven structure is preferably triangular, square, or hexagonal, because, in such a case, an area ratio of the bottom surfaces of the uneven structures to the light emission plane can be higher. As the area ratio thereof is higher, a condition under which light emitted by the solid-state light-emitting element is totally reflected is less likely to be fulfilled and light extraction efficiency is increased. Therefore, a figure which allows the area ratio thereof to be high is preferably employed.

Further, the uneven structure of the light incident plane may have a single-layer structure or a structure in which a plurality of layers are stacked. For example, in a preferable structure, at the interface between the solid-state light-emitting element and the optical element, an inorganic material film with a light-transmitting property and a barrier property which has a refractive index greater than the refractive index of a medium used for the optical element and less than the refractive index of the solid-state light-emitting element is provided. As the inorganic material film, a silicon oxide film or a silicon oxynitride film can be used, for example. The inorganic material film with a light-transmitting property and a barrier property can suppress diffusion of an impurity to the solid-state light-emitting element without reducing light extraction efficiency. For example, when the solid-state light-emitting element is an organic EL element, entry of an impurity such as moisture into a light-emitting body can be suppressed and the reliability of the light-emitting device can be improved.

Examples of the uneven structures of the light emission plane and the light incident plane are illustrated in FIGS. 5A-1, 5A-2, 5B-1, 5B-2, 5B-3, 5C-1, 5C-2, 5C-3, 5D-1, and 5D-2 and FIGS. 6A-1, 6A-2, 6B-1, 6B-2, 6C-1, 6C-2, 6D-1, and 6D-2. Note that only the uneven structures are described and description of the bubbles in the optical element is omitted here.

An example of an optical element having uneven structures at both the light emission plane side and the solid-state light-emitting element side is illustrated in FIG. 5A-1 and FIG. 5A-2, which are a plan view and a cross-sectional view taken along a dashed-dotted line E-F in the plan view, respectively. A different example of the figure in FIG. 5A-1 is illustrated in FIGS. 5B-1, 5B-2, and 5B-3, which are a plan view, a cross-sectional view taken along a dashed-dotted line E-F in the plan view, and a cross-sectional view taken along a dashed-dotted line G-H in the plan view, respectively. Another example of the figure in FIG. 5A-1 is illustrated in FIGS. 5C-1, 5C-2, and 5C-3, which are a plan view, a cross-sectional view taken along a dashed-dotted line E-F in the plan view, and a cross-sectional view taken along a dashed-dotted line G-H in the plan view, respectively. Further, an example of an optical element having a semi-columnar structure at a light emission plane is illustrated in FIGS. 5D-1 and 5D-2, which are a plan view and a cross-sectional view taken along a dashed-dotted line E-F in the plan view, respectively.

Further, an example of an optical element having a pyramidal structure at a light emission plane is illustrated in FIGS. 6A-1 and 6A-2, which are a plan view and a cross-sectional view taken along a dashed-dotted line E-F in the plan view, respectively. A further example of the optical element having a pyramidal structure is illustrated in FIGS. 6B-1 and 6B-2, which are a plan view and a cross-sectional view taken along a dashed-dotted line E-F in the plan view, respectively. A still further example of the optical element having a pyramidal structure is illustrated in FIGS. 6C-1 and 6C-2, which are a plan view and a cross-sectional view taken along a dashed-dotted line E-F in the plan view, respectively. Further, an example of an optical element having a prismatic structure at a light emission plane is illustrated in FIGS. 6D-1 and 6D-2, which are a plan view and a cross-sectional view taken along a dashed-dotted line E-F in the plan view, respectively.

The uneven structures of the optical element which are illustrated in FIGS. 5A-1, 5A-2, 5B-1, 5B-2, 5B-3, 5C-1, 5C-2, 5C-3, 5D-1, and 5D-2 and FIGS. 6A-1, 6A-2, 6B-1, 6B-2, 6C-1, 6C-2, 6D-1, and 6D-2 can be freely combined.

The light-emitting device described in this embodiment extracts light emitted by the solid-state light-emitting element to the air through the optical element whose apparent refractive index continuously decreases from the solid-state light-emitting element toward the air because of the bubbles included in the optical element; accordingly, in the light-emitting device, a refractive index difference at an interface is small, light reflection is suppressed, and high light extraction efficiency is achieved.

Further, the optical element may have an uneven structure at the light emission plane or the light incident plane. With such a structure, total reflection at an interface is further suppressed, so that the light-emitting device has high light extraction efficiency.

Thus, an optical element which can efficiently extract light from a region having a high refractive index to a region having a low refractive index can be provided.

The light-emitting device of this embodiment can be combined with any of the other embodiments as appropriate.
(Embodiment 2)

In this embodiment, a method for manufacturing an optical element according to one embodiment of the present invention is described with reference to FIGS. 3A to 3C and FIGS. 4A to 4C.

The optical element manufactured by the method described in this embodiment is a flat organic resin member into which bubbles are injected so that an apparent refractive index gradually decreases from one plane toward the other plane.

Figure 3A:
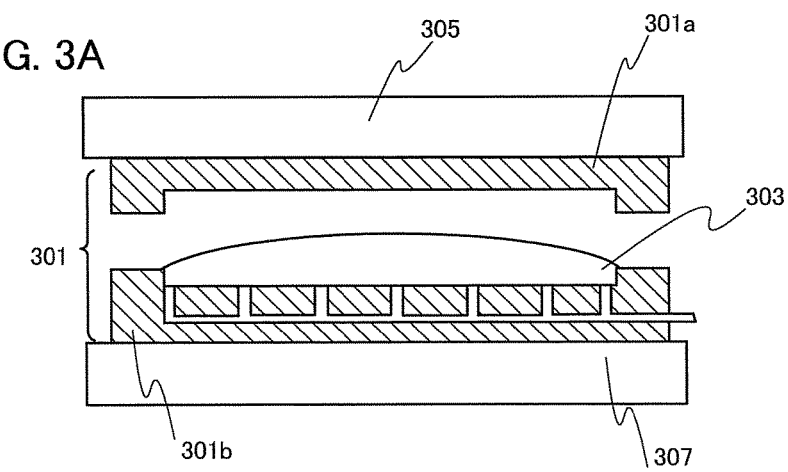
FIGS. 3A to 3C illustrate a method for manufacturing an optical element according to one embodiment of the present invention.

In the first step, an organic resin 303 is provided in molds 301 to be shaped as illustrated in FIG. 3A.

The molds 301 are a pair of molds of an upper mold 301a and a lower mold 301b, which are set between an upper heating plate 305 and a lower heating plate 307 of a heat press. Heat and pressure can be applied to the molds 301 through the upper heating plate 305 and the lower heating plate 307 of the heat press. Further, the upper heating plate 305 and the lower heating plate 307 are supplied with heat by respective heat sources, so that the upper mold 301a and the lower mold 301b of the molds 301 can be heated to different temperatures by application of heat at different temperatures.

For shaping the organic resin 303, first, the molds 301 are heated to make a temperature of the organic resin 303 higher than or equal to the softening point. Heat can be applied in such a manner that the organic resin 303 has a temperature higher than or equal to the softening point. Note that it is preferable that the upper mold 301a and the lower mold 301b of the molds 301 have the same temperature and that the temperature and the fluidity be uniform in the resin, as a result of application of uniform heat from the upper heating plate 305 and the lower heating plate 307 of the heat press at this time.

At the same time, the molds 301 are pressed against each other by pressure application by the heat press. The pressure can be applied in such a manner that the organic resin 303 evenly spreads in the molds 301 and the pressure is uniformly applied to the entire resin.

Figure 3B:
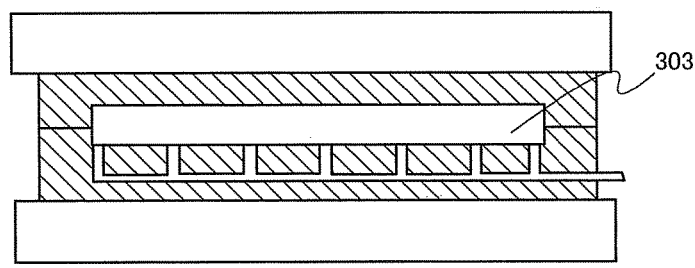

When the temperature of the organic resin 303 becomes higher than or equal to the softening point, the organic resin 303 has fluidity to have a shape corresponding to the shape of the molds 301 by the molds 301 which are pressed against each other by the heat press (see FIG. 3B).

Figure 3C:
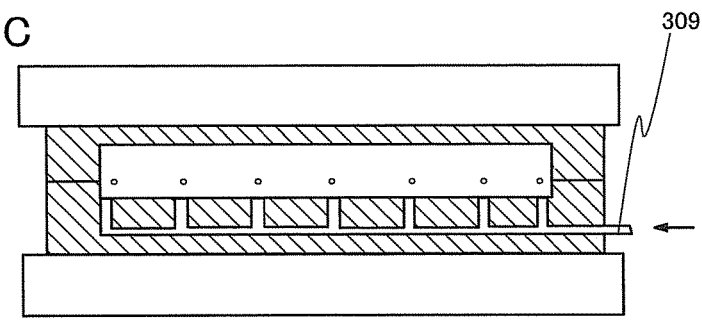

Even after shaping of the organic resin 303 is completed, application of heat and pressure by the heat press is continued, and subsequently, bubbles are cyclically injected into the organic resin in the molds 301 through a tube 309 provided to the lower mold 301b in the second step (see FIG. 3C).

The bubble injected into the organic resin 303 preferably has as small diameter as possible. The diameter of the bubble is preferably greater than or equal to 10 nm and less than or equal to 10 μm. The reason for this is that light is not refracted or reflected due to the bubble at the time of proceeding in the optical element in the case where the bubble has a diameter less than or equal to the wavelength of the light which enters the optical element. The bubble can be reduced in size by pressure application to the bubble in a pulsed manner.

During a period when the bubbles are injected, heat is applied to the upper heating plate 305 and the lower heating plate 307 so that the temperature of the organic resin 303 is kept higher than or equal to the softening point. When the organic resin 303 is kept at a temperature higher than or equal to the softening point and has fluidity, the bubbles injected from the lower mold 301b rises to the vicinity of the upper mold 301a because the density of the air in the bubble is smaller than that of the organic resin (see FIG. 4A).

Note that the pressure for injection of the bubbles into the organic resin 303 may be such that the organic resin 303 can be pushed out. At this time, pressure application is still continued in the heat press to press the molds 301 against each other. Since shaping of the organic resin 303 has been already completed, substantially all the pressure by the heat press is applied to the molds 301 and substantially no pressure is thus applied to the organic resin in the molds 301. Moreover, pressure in the organic resin 303 is low. Accordingly, pressure for injecting the bubbles is not necessarily high.

By cyclical injection of the bubbles, the bubbles are arranged in the organic resin at regular intervals. The cycle of injecting the bubbles can be appropriately determined in consideration of the organic resin used or the pressure for injecting the bubbles. Any cycle can be employed as long as the bubbles are uniformly arranged in the organic resin.

In the third step, the heat supply to the upper heating plate 305 of the heat press is stopped.

The stop of the heat supply to the upper heating plate 305 makes the heat supply to an upper portion of the organic resin 303 stop and the organic resin 303 is reduced in temperature and cured from the upper portion after the temperature of the organic resin becomes lower than or equal to the softening point. In the cure, the upper portion of the organic resin is cured with the bubbles included therein.

Note that for decreasing the temperature of the upper heating plate 305, cooling of the upper heating plate 305 may be performed in addition to natural cooling by stopping the heat supply. A temperature falling rate of the upper heating plate 305 is changed, whereby a cure rate of the organic resin changes.

Further, at this time, the heat supply to the lower heating plate 307 of the heat press is continued so that a lower portion of the organic resin 303 is kept at a temperature higher than or equal to the softening point.

In the fourth step, which is performed after the heat supply to the upper heating plate 305 is stopped and the upper portion of the organic resin 303 starts to be cured, the cycle of injecting the bubbles into the organic resin 303 is made longer. Thus, the density distribution of the bubbles can be varied.

The temperature of the upper portion of the organic resin decreases to be lower than or equal to the softening point and the upper portion is cured; thus, no more bubbles are injected into the upper portion of the organic resin 303. On the other hand, the lower portion of the organic resin 303 is kept at a temperature higher than or equal to the softening point by heat applied by the lower heating plate 307, so that the bubbles injected in the longer cycle are injected into the lower portion of the organic resin 303 which has a temperature higher than or equal to the softening point.

In this manner, by changing the cycle of injecting the bubbles, the upper portion and the lower portion of the organic resin 303 can be different in number density of the injected bubbles. Note that the cycle of injecting the bubbles is appropriately determined depending on a condition such as the density or the softening point of the organic resin, pressure for injecting the bubbles, heat applied by the heat press.

Furthermore, at the timing when the cycle of injecting the bubbles is changed, for adjustment of the number density of the bubbles in the optical element, the cure rate of the organic resin 303 may be changed by changing the temperature falling rate of the upper heating plate. By changing the cycle of injecting the bubbles in accordance with a timing when the organic resin has a temperature lower than or equal to the softening point and cured from its upper portion, the density distribution of the bubbles in the organic resin can be varied.

After that, the step of making the cycle of injecting the bubbles longer may be performed two or more times. The cycle of injecting the bubbles into the organic resin 303 can be appropriately adjusted in accordance with the timing when the resin is cured so that the number of the bubbles distributed near an upper surface of the organic resin becomes the largest.

Figure 4A:
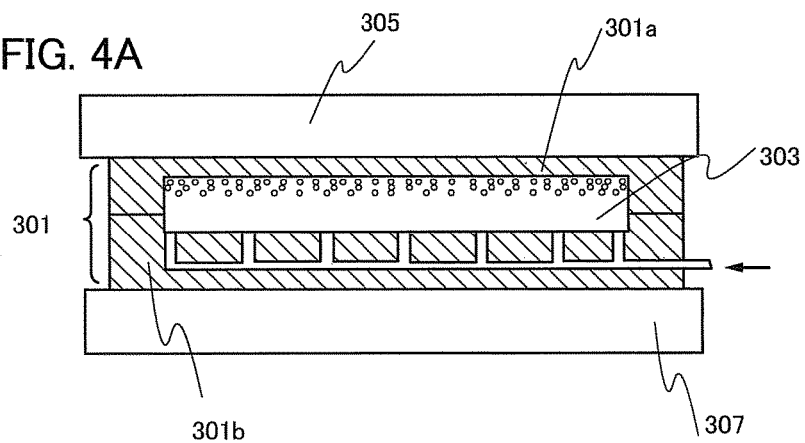
FIGS. 4A to 4C illustrate a method for manufacturing an optical element according to one embodiment of the present invention.
Figure 4B:
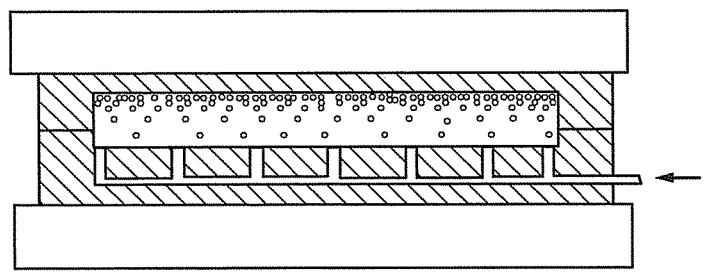

By continuously changing the cycle of injection, the number density of the bubbles in the organic resin member continuously varies, so that an apparent refractive index in the organic resin continuously varies, reflection in the organic resin is thus suppressed, and light extraction efficiency is improved (see FIG. 4B).

In the fifth step, the injection of bubbles into the organic resin is stopped. After the bubbles are evenly distributed in the organic resin 303, the injection of the bubbles is stopped so that no bubbles are injected in the vicinity of the lower mold 301b.

In the sixth step, the heat supply to the lower heating plate 307 is stopped, and cooling is performed until the entire organic resin is cured. At this time, in addition to natural cooling for curing the organic resin by stopping the heat supply, artificial cooling of the upper heating plate and the lower heating plate may be performed for adjustment of the cure rate of the organic resin.

Note that the fifth and sixth steps may be performed in the reverse order. In the case where the organic resin stays at a temperature higher than or equal to the softening point even after the heat supply to the lower heating plate 307 is stopped, it is possible to stop the heat supply first so that the bubbles are injected with the resin being cured.

It is also possible to artificially cool down the heating plate with a temperature falling rate adjusted so that the bubbles are injected with the resin being cured. By adjusting the cure rate of the resin and the cycle of injecting bubbles, the bubbles can be more evenly distributed in the organic resin.

Figure 4C:
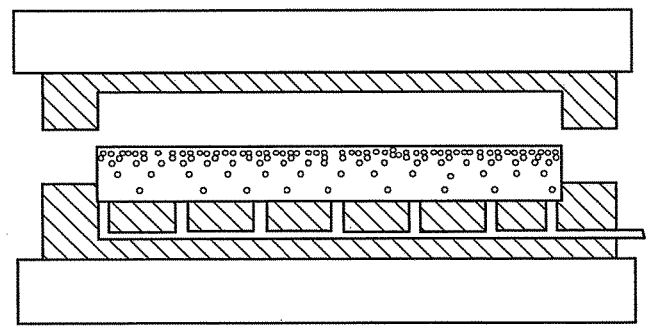

After the organic resin is completely cured, pressure application to the organic resin is stopped (see FIG. 4C).

Through the above steps, the optical element is completed.

In the case where an uneven structure such as those described in the modification examples in Embodiment 1 is provided to the optical element, an organic resin can be placed in molds having an uneven structure and shaped. Note that in the case where an uneven structure is manufactured with a heat press, molds are preferably set in such a manner that a plane (light emission plane) of the optical element which is to be in contact with the air faces upward and a plane (light incident plane) of the optical element which is to be in contact with the solid-state light-emitting element faces downward.

Having a lower density than the organic resin; the bubble injected into the organic resin tends to collect in the upper portion of the organic resin. Therefore, the plane (light emission plane) of the optical element which is to be in contact with the air and in which more bubbles are to be distributed is preferably set to face upward, in which case a special mechanism to make bubbles collect on the light emission plane side is not needed.

Further, it is also possible to provide the uneven structure after the organic resin member is shaped with the heat press. For example, the uneven structure can be formed using any of the following methods as appropriate: an etching method, a sand blasting method, a microblast processing method, a droplet discharge method, a printing method (screen printing or offset printing by which a pattern is formed), a coating method such as a spin coating method, a dipping method, a dispenser method, imprint method, a nanoimprint method, and the like.

The light-emitting device, which uses an optical element manufactured by the method described in this embodiment and having a continuously varying refractive index, extracts light emitted by the solid-state light-emitting element to the air through the optical element whose refractive index continuously decreases from the solid-state light-emitting element toward the air; accordingly, in the light-emitting device, a refractive index difference at an interface is small, light reflection is suppressed, and high light extraction efficiency is achieved.

This embodiment can be combined with any of the other embodiments as appropriate.

(Embodiment 3)

In this embodiment, a solid-state light-emitting element included in a light-emitting device according to one embodiment of the present invention is described. In this embodiment, an organic EL element is used as the solid-state light-emitting element. An example of an organic EL element is described with reference to FIGS. 7A to 7C.

Figure 7A:
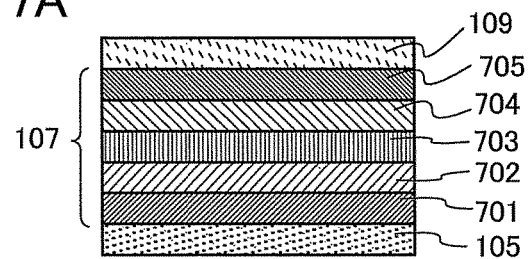
FIGS. 7A to 7C each illustrate a solid-state light-emitting element used in a light-emitting device according to one embodiment of the present invention.

A light-emitting element illustrated in FIG. 7A includes a transparent electrode 105, a light-emitting region 107 over the transparent electrode 105, and a reflective electrode 109 over the light-emitting region 107.

In the light-emitting device described in this embodiment, the transparent electrode 105 functions as an anode and the reflective electrode 109 functions as a cathode; however, the present invention is not limited thereto. In other words, a structure in which the transparent electrode 105 functions as a cathode and the reflective electrode 109 functions as an anode may be employed.

The light-emitting region 107 may include at least a light-emitting layer containing a light-emitting organic compound. In addition, the light-emitting region 107 can have a stacked-layer structure in which a layer containing a substance having a high electron-transport property, a layer containing a substance having a high hole-transport property, a layer containing a substance having a high electron-injection property, a layer containing a substance having a high hole-injection property, a layer containing a bipolar substance (a substance having a high electron-transport property and a high hole-transport property), and the like are combined as appropriate. In this embodiment, a hole-injection layer 701, a hole-transport layer 702, a light-emitting layer 703, an electron-transport layer 704, and an electron-injection layer 705 are stacked in this order from the transparent electrode 105 side in the light-emitting region 107.

A method for manufacturing an organic EL element illustrated in FIG. 7A will be described.

First, the transparent electrode 105 is formed over an optical element. For the transparent electrode 105 functioning as an anode, any of metals, alloys, electrically conductive compounds, mixtures thereof, and the like which has a high work function (specifically, a work function of 4.0 eV or more) is preferably used. Specific examples include indium tin oxide, indium oxide-tin oxide containing silicon or silicon oxide, indium zinc oxide, indium oxide containing tungsten oxide and zinc oxide, and the like. Other than these, gold, platinum, nickel, tungsten, chromium, molybdenum, iron, cobalt, copper, palladium, titanium, or the like can be used. Note that in this specification, a transparent electrode refers to an electrode having a light-transmitting property; accordingly, an electrode is called a transparent electrode when light is transmitted therethrough. In other words, in this specification, even an opaque or colored electrode is called a transparent electrode when having a light-transmitting property.

However, when a layer which is in contact with the transparent electrode 105 and included in the light-emitting region 107 is formed using a composite material described later in which an organic compound and an electron acceptor (acceptor) are mixed, as a substance used for the transparent electrode 105, any of a variety of metals, alloys, and electrically conductive compounds, a mixture thereof, and the like can be used regardless of work function. For example, aluminum, silver, an alloy containing aluminum (e.g., Al—Si), or the like can also be used.

The transparent electrode 105 can be formed by, for example, a sputtering method, an evaporation method (including a vacuum evaporation method), or the like.

Then, the light-emitting region 107 is formed over the transparent electrode 105. In this embodiment, the light-emitting region 107 includes the hole-injection layer 701, the hole-transport layer 702, the light-emitting layer 703, the electron-transport layer 704, and the electron-injection layer 705.

The hole-injection layer 701 is a layer that includes a substance having a high hole-injection property. As the substance having a high hole-injection property, for example, a metal oxide such as molybdenum oxide, titanium oxide, vanadium oxide, rhenium oxide, ruthenium oxide, chromium oxide, zirconium oxide, hafnium oxide, tantalum oxide, silver oxide, tungsten oxide, or manganese oxide can be used. A phthalocyanine-based compound such as phthalocyanine (abbreviation: $H_2Pc$), or copper(II) phthalocyanine (abbreviation: CuPc) can also be used.

Any of the following aromatic amine compounds which are low molecular organic compounds can also be used: 4,4',4"-tris(N,N-diphenylamino)triphenylamine (abbreviation: TDATA), 4,4',4"-tris[N-(3-methylphenyl)-N-phenylamino]triphenylamine (abbreviation: MTDATA), 4,4'-bis[N-(4-diphenylaminophenyl)-N-phenylamino]biphenyl (abbreviation: DPAB), N,N'-bis{4-[bis(3-methylphenyl)amino]phenyl}diphenyl-(1,1'-biphenyl)-4,4'-diamine (abbreviation: DNTPD), 1,3,5-tris[N-(4-diphenylaminophenyl)-N-phenylamino]benzene (abbreviation: DPA3B), 3-[N-(9-phenylcarbazol-3-yl)-N-phenylamino]-9-phenylcarbazole (abbreviation: PCzPCA1), 3,6-bis[N-(9-phenylcarbazol-3-yl)-N-phenylamino]-9-phenylcarbazole (abbreviation: PCzPCA2), 3-[N-(1-naphthyl)-N-(9-phenylcarbazol-3-yl)amino]-9-phenylcarbazole (abbreviation: PCzPCN1), and the like.

A high molecular compound (e.g., an oligomer, a dendrimer, or a polymer) can also be used. Examples are high molecular compounds such as poly(N-vinylcarbazole) (abbreviation: PVK), poly(4-vinyltriphenylamine) (abbreviation: PVTPA), poly[N-(4-{N'-[4-(4-diphenylamino)phenyl]phenyl-N'-phenylamino}phenyl)methacrylamide] (abbreviation: PTPDMA), and poly[N,N'-bis(4-butylphenyl)-N,N'-bis(phenyl)benzidine] (abbreviation: Poly-TPD). A high molecular compound to which acid is added, such as poly(3,4-ethylenedioxythiophene)/poly(styrenesulfonic acid) (PEDOT/PSS), or polyaniline/poly(styrenesulfonic acid) (PAni/PSS), can also be used.

In particular, for the hole-injection layer 701, a composite material in which an acceptor substance is mixed with an organic compound having a high hole-transport property is preferably used. With the use of the composite material in which an acceptor substance is mixed with a substance having a high hole-transport property, hole injection from the transparent electrode 105 is facilitated, which results in a reduction in the driving voltage of the light-emitting element. Such a composite material can be formed by co-evaporation of a substance having a high hole-transport property and a substance having an acceptor property. The hole-injection layer 701 is formed using the composite material, whereby hole injection from the transparent electrode 105 into the light-emitting region 107 is facilitated.

As the organic compound used for the composite material, any of a variety of compounds such as aromatic amine compounds, carbazole derivatives, aromatic hydrocarbons, and high molecular compounds (e.g., oligomers, dendrimers, and polymers) can be used. The organic compound used for the composite material is preferably an organic compound having a high hole-transport property. Specifically, a substance having a hole mobility of $10^{-6}$ cm$^2$/Vs or more is preferably used. Note that other than these substances, a substance that has a property of transporting more holes than electrons may be used. The organic compounds which can be used for the composite material are specifically given below.

Examples of the organic compounds that can be used for the composite material include the following: aromatic amine compounds such as TDATA, MTDATA, DPAB, DNTPD, DPA3B, PCzPCA1, PCzPCA2, PCzPCN1, 4,4'-bis[N-(1-naphthyl)-N-phenylamino]biphenyl (abbreviation: NPB or α-NPD), N,N'-bis(3-methylphenyl)-N,N'-diphenyl-[1,1'-biphenyl]-4,4'-diamine (abbreviation: TPD), and 4-phenyl-4'-(9-phenylfluoren-9-yl)triphenylamine (abbreviation: BPAFLP); and carbazole derivatives such as 4,4'-di(N-carbazolyl)biphenyl (abbreviation: CBP), 1,3,5-tris[4-(N-carbazolyl)phenyl]benzene (abbreviation: TCPB), 9-[4-(N-carbazolyl)phenyl]-10-phenylanthracene (abbreviation: CzPA), 9-[4-(9-phenylcarbazol-3-yl)]phenyl-10-phenylanthracene (abbreviation: PCzPA), and 1,4-bis[4-(N-carbazolyl)phenyl]-2,3,5,6-tetraphenylbenzene.

Any of the following aromatic hydrocarbon compounds can be used: 2-tert-butyl-9,10-di(2-naphthyl)anthracene (abbreviation: t-BuDNA), 2-tert-butyl-9,10-di(1-naphthyl)anthracene, 9,10-bis(3,5-diphenylphenyl)anthracene (abbreviation: DPPA), 2-tert-butyl-9,10-bis(4-phenylphenyl)anthracene (abbreviation: t-BuDBA), 9,10-di(2-naphthyl)anthracene (abbreviation: DNA), 9,10-diphenylanthracene (abbreviation: DPAnth), 2-tert-butylanthracene (abbreviation: t-BuAnth), 9,10-bis(4-methyl-1-naphthyl)anthracene (abbreviation: DMNA), 2-tert-butyl-9,10-bis[2-(1-naphthyl) phenyl]anthracene, 9,10-bis[2-(1-naphthyl)phenyl]anthracene, and 2,3,6,7-tetramethyl-9,10-di(1-naphthyl)anthracene.

Any of the following aromatic hydrocarbon compounds can be used: 2,3,6,7-tetramethyl-9,10-di(2-naphthyl)anthracene, 9,9'-bianthryl, 10,10'-diphenyl-9,9'-bianthryl, 10,10'-bis(2-phenylphenyl)-9,9'-bianthryl, 10,10'-bis[(2,3,4,5,6-pentaphenyl)phenyl]-9,9'-bianthryl, anthracene, tetracene, rubrene, perylene, 2,5,8,11-tetra(tert-butyl)perylene, pentacene, coronene, 4,4'-bis(2,2-diphenylvinyl)biphenyl (abbreviation: DPVBi), and 9,10-bis[4-(2,2-diphenylvinyl)phenyl] anthracene (abbreviation: DPVPA).

Examples of the electron acceptor include organic compounds such as 7,7,8,8-tetracyano-2,3,5,6-tetrafluoroquinodimethane (abbreviation: F$_4$-TCNQ) and chloranil and transition metal oxides. Other examples include oxides of metals that belong to any of Groups 4 to 8 in the periodic table. Specifically, vanadium oxide, niobium oxide, tantalum oxide, chromium oxide, molybdenum oxide, tungsten oxide, manganese oxide, and rhenium oxide are preferable since their electron-accepting property is high. Among these, molybdenum oxide, which is easy to handle owing to its stability in the air and low hygroscopic property, is particularly preferred.

The composite material may be formed using the above-described electron acceptor and the above-described high molecular compound such as PVK, PVTPA, PTPDMA, or Poly-TPD, and used for the hole-injection layer 701.

The hole-transport layer 702 is a layer that includes a substance having a high hole-transport property. Examples of the substance having a high hole-transport property include aromatic amine compounds such as NPB, TPD, BPAFLP, 4,4'-bis[N-(9,9-dimethylfluoren-2-yl)-N-phenylamino]biphenyl (abbreviation: DFLDPBi), and 4,4'-bis [N-(spiro-9,9'-bifluoren-2-yl)-N-phenylamino]biphenyl (abbreviation: BSPB). The substances mentioned here are mainly substances that have a hole mobility of $10^{-6}$ cm$^2$/Vs or more. Note that other than these substances, a substance that has a property of transporting more holes than electrons may be used. Note that the layer that includes a substance having a high hole-transport property is not limited to a single layer, and may be a stack of two or more layers including any of the above substances.

For the hole-transport layer 702, a carbazole derivative such as CBP, CzPA, or PCzPA or an anthracene derivative such as t-BuDNA, DNA, or DPAnth may also be used.

For the hole-transport layer 702, a high molecular compound such as PVK, PVTPA, PTPDMA, or Poly-TPD can also be used.

The light-emitting layer 703 is a layer containing a light-emitting organic compound. As the light-emitting organic compound, for example, a fluorescent compound which exhibits fluorescence or a phosphorescent compound which exhibits phosphorescence can be used.

In one embodiment of the present invention, the organic EL element may include two or more light-emitting layers. Further, when a plurality of light-emitting layers are provided and emission colors of the light-emitting layers are made different, light emission of a desired color can be obtained from the light-emitting element as a whole.

Examples of a fluorescent compound that can be used for the light-emitting layer 703 are the following light-emitting materials: materials that emit blue light, such as N,N'-bis[4-(9H-carbazol-9-yl)phenyl]-N,N-diphenylstilbene-4,4'-diamine (abbreviation: YGA2S), 4-(9H-carbazol-9-yl)-4'-(10-phenyl-9-anthryl)triphenylamine (abbreviation: YGAPA), and 4-(10-phenyl-9-anthryl)-4'-(9-phenyl-9H-carbazol-3-yl) triphenylamine (abbreviation: PCBAPA); materials that emit green light, such as 9,10-diphenyl-2-[N-phenyl-N-(9-phenyl-9H-carbazol-3-yl)amino]anthracene (abbreviation: 2PCAPA), 9,10-(biphenyl-2-yl)-2-[N-phenyl-N-(9-phenyl-9H-carbazol-3-yl)amino]anthracene (abbreviation: 2PCABPhA), 9,10-diphenyl-2-[N-(4-diphenylaminophenyl)-N-phenylamino]anthracene (abbreviation: 2DPAPA), 9,10-di (2-biphenylyl)-2-[N-(4-diphenylaminophenyl)-N-phenylamino]anthracene (abbreviation: 2DPABPhA), 9,10-di(2-biphenylyl)-2-{N-[4-(9H-carbazol-9-yl)phenyl]-N-phenylamino}anthracene (abbreviation: 2YGABPhA), and 9-(N,N-diphenylamino)-10-phenylanthracene (abbreviation: DPhAPhA); materials that emit yellow light, such as rubrene and 5,12-bis(1,1'-biphenyl-4-yl)-6,11-diphenyltetracene (abbreviation: BPT); and materials that emit red light, such as N,N,N',N'-tetrakis(4-methylphenyl)tetracene-5,11-diamine (abbreviation: p-mPhTD) and 7,14-diphenyl-N,N,N',N'-tetrakis(4-methylphenyl)acenaphtho[1,2-a]fluoranthene-3,10-diamine (abbreviation: p-mPhAFD).

The phosphorescent compounds that can be used for the light-emitting layer 703 will be given. Examples of material that emit blue light include bis[2-(4',6'-difluorophenyl) pyridinato-N,C$^{2'}$]iridium(III)tetrakis(1-pyrazolyl)borate (abbreviation: FIr6), bis[2-(4',6'-difluorophenyl)pyridinato-N,C$^{2'}$]iridium(III)picolinate (abbreviation: FIrpic), bis{2-[3',5'-bis(trifluoromethyl)phenyl]pyridinato-N,C$^{2'}$}iridium (III)picolinate (abbreviation: Ir(CF$_3$ppy)$_2$(pic)), and bis[2-(4',6'-difluorophenyl)pyridinato-N,C$^{2'}$]iridium(III) acetylacetonate (abbreviation: FIr(acac)). Examples of materials that emit green light include tris(2-phenylpyridinato-N,C$^{2'}$)iridium(III) (abbreviation: Ir(ppy)$_3$), bis(2-phenylpyridinato-N,C$^{2'}$)iridium(III)acetylacetonate (abbreviation: Ir(ppy)$_2$(acac)), bis(1,2-diphenyl-1H-benzimidazolato) iridium(III)acetylacetonate (abbreviation: Ir(pbi)$_2$(acac)), bis(benzo[h]quinolinato)iridium(III)acetylacetonate (abbreviation: Ir(bzq)$_2$(acac)), and tris(benzo[h]quinolinato)iridium(III) (abbreviation: Ir(bzq)$_3$). Examples of materials that emit yellow light include bis(2,4-diphenyl-1,3-oxazolato-N, C$^{2'}$)iridium(III)acetylacetonate (abbreviation: Ir(dpo)$_2$(acac)), bis{2-[4'-(perfluorophenylphenyl)]pyridinato-N,C$^{2'}$}iridium(III)acetylacetonate (abbreviation: Ir(p-PF-ph)$_2$(acac)), bis(2-phenylbenzothiazolato-N,C$^{2'}$)iridium(III)acetylacetonate (abbreviation: Ir(bt)$_2$(acac)), (acetylacetonato)bis[2,3-bis(4-fluorophenyl)-5-methylpyrazinato]iridium(III) (abbreviation: Ir(Fdppr-Me)$_2$(acac)), and (acetylacetonato)bis[2-(4-methoxyphenyl)-3,5-dimethylpyrazinato]iridium(III) (abbreviation: Ir(dmmoppr)$_2$(acac)). Examples of materials that emit orange light include tris(2-phenylquinolinato-N,C$^{2'}$)iridium(III) (abbreviation: Ir(pq)$_3$), bis(2-phenylquinolinato-N,C$^{2'}$)indium(III)acetylacetonate (abbreviation: Ir(pq)$_2$(acac)), (acetylacetonato)bis(3,5-dimethyl-2-phenylpyrazinato)iridium(III) (abbreviation: Ir(mppr-Me)$_2$(acac)), and (acetylacetonato)bis(5-isopropyl-3-methyl-2-phenylpyrazinato)iridium(III) (abbreviation: Ir(mppr-iPr)$_2$(acac)). Examples of materials that emit red light include organometallic complexes such as bis[2-(2'-benzo[4,5-a]thienyl)pyridinato-N,C$^{3'}$.]iridium(III) acetylacetonate (abbreviation: Ir(btp)$_2$(acac)), bis(1-phenylisoquinolinato-N,C$^{2'}$)iridium(III)acetylacetonate (abbreviation: Ir(piq)$_2$(acac)), bis[2,3-bis(4-fluorophenyl)quinoxalinato]iridium(III) acetylacetonate (abbreviation: Ir(Fdpq)$_2$(acac)), (acetylacetonato)bis(2,3,5-triphenylpyrazinato)iridium(III) (abbreviation: Ir(tppr)$_2$(acac)), bis(2,3,5-triphenylpyrazinato)iridium(III) (abbreviation: Ir(tppr)$_2$(dpm)), and (2,3,7,8,12,13,17,18-octaethyl-21H,23H-porphyrinato)platinum(II) (abbreviation: PtOEP). Further, rare earth metal complexes, such as tris(acetylacetonato) (monophenanthroline)terbium(III) (abbreviation: Tb(acac)$_3$(Phen)), tris(1,3-diphenyl-1,3-propanedionato)(monophenanthroline)europium(III) (abbreviation: Eu(DBM)$_3$(Phen)), and tris[1-(2-thenoyl)-3,3,3-trifluoroacetonato](monophenanthroline)europium(III) (abbreviation: Eu(TTA)$_3$(Phen)), exhibit light emission from rare earth metal ions (electron transition between different multiplicities), and thus can be used as phosphorescent compounds.

Note that the light-emitting layer 703 may have a structure in which the above light-emitting organic compound (a guest material) is dispersed in another substance (a host material). As a host material, various kinds of materials can be used, and it is preferable to use a substance which has a lowest unoccupied molecular orbital level (LUMO level) higher than the light-emitting substance and has a highest occupied molecular orbital level (HOMO level) lower than that of the light-emitting substance.

Specific examples of the host material are as follows: a metal complex such as tris(8-quinolinolato)aluminum(III) (abbreviation: Alq), tris(4-methyl-8-quinolinolato)aluminum(III) (abbreviation: Almq$_3$), bis(10-hydroxybenzo[h]quinolinato)beryllium(II) (abbreviation: BeBq$_2$), bis(2-methyl-8-quinolinolato)(4-phenylphenolato)aluminum(III) (abbreviation: BAlq), bis(8-quinolinolato)zinc(II) (abbreviation: Znq), bis[2-(2-benzoxazolyl)phenolato]zinc(II) (abbreviation: ZnPBO), or bis[2-(2-benzothiazolyl)phenolato]zinc(II) (abbreviation: ZnBTZ); a heterocyclic compound such as 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 3-(4-biphenylyl)-4-phenyl-5-(4-tert-butylphenyl)-1,2,4-triazole (abbreviation: TAZ), 2,2',2''-(1,3,5-benzenetriyl)-tris(1-phenyl-1H-benzimidazole) (abbreviation: TPBI), bathophenanthroline (abbreviation: BPhen), or bathocuproine (abbreviation: BCP); a condensed aromatic compound such as 9-[4-(N-carbazolyl)phenyl]-10-phenylanthracene (abbreviation: CzPA), 9-[4-(3,6-diphenyl-N-carbazolyl)phenyl]-10-phenylanthracene (abbreviation: DPCzPA), 9,10-bis(3,5-diphenylphenyl)anthracene (abbreviation: DPPA), 9,10-di(2-naphthyl)anthracene (abbreviation: DNA), 2-tert-butyl-9,10-di(2-naphthyl)anthracene (abbreviation: t-BuDNA), 9,9'-bianthryl (abbreviation: BANT), 9,9'-(stilbene-3,3'-diyl)diphenanthrene (abbreviation: DPNS), 9,9'-(stilbene-4,4'-diyl)diphenanthrene (abbreviation: DPNS2), 1,3,5-tri(1-pyrenyl)benzene (abbreviation: TPB3), 9,10-diphenylanthracene (abbreviation: DPAnth), or 6,12-dimethoxy-5,11-diphenylchrysene; an aromatic amine compound such as 9-{4-[3-(N,N-diphenylamino)-N-carbazolyl]phenyl}-10-phenylanthracene (abbreviation: CzAlPA), 4-(10-phenyl-9-anthryl)triphenylamine (abbreviation: DPhPA), 9-phenyl-10-(4-[N-phenyl-N-{3-(N-phenyl)carbazolyl}]amino)phenylanthracene (abbreviation: PCAPA), 9-[4'-{N-phenyl-N-(9-phenylcarbazol-3-yl)}aminobiphenyl-4-yl]-10-phenylanthracene (abbreviation: PCAPBA), 9,10-diphenyl-2-[N-phenyl-N-(9-phenyl-9H-carbazol-3-yl)amino]anthracene (abbreviation: 2PCAPA), NPB (or α-NPD), TPD, DFLDPBi, or BSPB; and the like.

Alternatively, as the host material, plural kinds of materials can be used. For example, in order to suppress crystallization, a substance such as rubrene which suppresses crystallization, may be further added. In addition, NPB, Alq, or the like may be further added in order to efficiently transfer energy to the guest material.

When a structure in which a guest material is dispersed in a host material is employed, crystallization of the light-emitting layer 703 can be suppressed. Further, concentration quenching due to high concentration of the guest material can be suppressed.

For the light-emitting layer 703, a high molecular compound can be used. Specific examples are the following light-emitting materials: materials that emit blue light, such as poly(9,9-dioctylfluorene-2,7-diyl) (abbreviation: PFO), poly[(9,9-dioctylfluorene-2,7-diyl)-co-(2,5-dimethoxybenzene-1,4-diyl)] (abbreviation: PF-DMOP), and poly{(9,9-dioctylfluorene-2,7-diyl)-co-[N,N'-di-(p-butylphenyl)-1,4-diaminobenzene]} (abbreviation: TAB-PFH); materials that emit green light, such as poly(p-phenylenevinylene) (abbreviation: PPV), poly[(9,9-dihexylfluorene-2,7-diyl)-alt-co-(benzo[2,1,3]thiadiazole-4,7-diyl)] (abbreviation: PFBT), and poly[(9,9-dioctyl-2,7-divinylenefluorenylene)-alt-co-(2-methoxy-5-(2-ethylhexyloxy)-1,4-phenylene)]; and materials that emit orange to red light, such as poly[2-methoxy-5-(2'-ethylhexoxy)-1,4-phenylenevinylene] (abbreviation: MEH-PPV), poly(3-butylthiophene-2,5-diyl), poly{[9,9-dihexyl-2,7-bis(1-cyanovinylene)fluorenylene]-alt-co-[2,5-bis(N,N'-diphenyl amino)-1,4-phenylene]}, and poly{[2-methoxy-5-(2-ethylhexyloxy)-1,4-bis(1-cyanovinylenephenylene)]-alt-co-[2,5-bis(N,N'-diphenylamino)-1,4-phenylene]} (abbreviation: CN-PPV-DPD).

The electron-transport layer 704 is a layer that includes a substance having a high electron-transport property. As examples of a substance having a high electron-transport property, the following can be given; metal complexes having a quinoline skeleton or a benzoquinoline skeleton, such as tris(8-quinolinolato)aluminum(III) (abbreviation: Alq), tris(4-methyl-8-quinolinolato)aluminum(III) (abbreviation: Almq$_3$), bis(10-hydroxybenzo[h]quinolinato)beryllium(II) (abbreviation: BeBq$_2$), or bis(2-methyl-8-quinolinolato)(4-phenylphenolato)aluminum(III) (abbreviation: BAlq). Other examples include metal complexes having an oxazole-based or thiazole-based ligand, such as bis[2-(2-benzoxazolyl)phenolato]zinc(II) (abbreviation: Zn(BOX)$_2$)

or bis[2-(2-hydroxyphenyl)benzothiazolato]zinc (abbreviation: Zn(BTZ)$_2$). Besides the metal complexes, 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 3-(4-biphenylyl)-4-phenyl-5-(4-tert-butylphenyl)-1,2,4-triazole (abbreviation: TAZ), bathophenanthroline (abbreviation: BPhen), bathocuproine (abbreviation: BCP), or the like can also be used. The substances mentioned here are mainly ones that have an electron mobility of $10^{-6}$ cm$^2$/Vs or higher. Furthermore, the electron transport layer is not limited to a single layer, and two or more layers made of the aforementioned substances may be stacked.

The electron-injection layer 705 is a layer that includes a substance having a high electron-injection property. For the electron-injection layer 705, an alkali metal, an alkaline earth metal, and a Compound thereof, such as lithium, cesium, calcium, lithium fluoride, cesium fluoride, calcium fluoride, or lithium oxide can be used. A rare earth metal compound such as erbium fluoride can be used. The above-mentioned substances for forming the electron-transport layer 704 can also be used.

Note that the hole-injection layer 701, the hole-transport layer 702, the light-emitting layer 703, the electron-transport layer 704, and the electron-injection layer 705 which are described above can be formed by a method, such as an evaporation method (e.g., a vacuum evaporation method), an inkjet method, or a coating method.

Figure 7B:
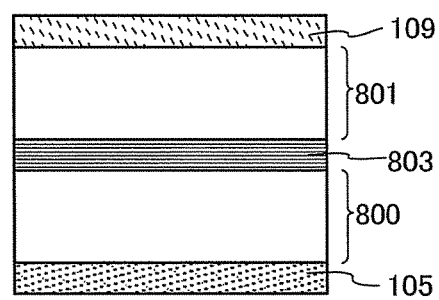

In the light-emitting region, as illustrated in FIG. 7B, a plurality of light-emitting layers may be stacked between the transparent electrode 105 and the reflective electrode 109. In this case, a charge generation layer 803 is preferably provided between a first EL layer 800 and a second EL layer 801 which are stacked. The charge generation layer 803 can be formed with either of the above-mentioned composite materials. Further, the charge generation layer 803 may have a stacked structure including a layer formed of the composite material and a layer formed of another material; in this case, as the layer formed of another material, a layer that includes a substance having an electron-donating property and a substance having a high electron-transport property, a layer formed of a transparent conductive film, or the like can be used. A light-emitting element having such a structure is less likely to have problems such as energy transfer and quenching, and gives an extensive choice of materials, and, accordingly, can easily be a light-emitting element having both high emission efficiency and a long lifetime. Further, a structure in which phosphorescence is obtained from one of the EL layers and fluorescence is obtained from the other is easily obtained. This structure can be combined with the above-mentioned structures of the EL layer.

Figure 7C:
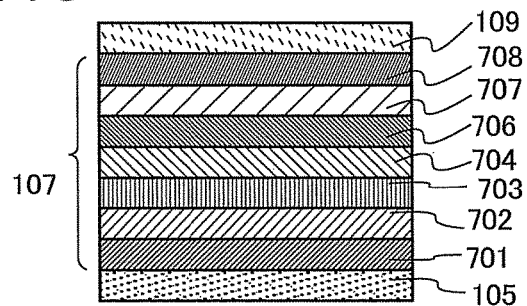

As illustrated in FIG. 7C, the light-emitting region 107 may include the hole-injection layer 701, the hole-transport layer 702, the light-emitting layer 703, the electron-transport layer 704, an electron-injection buffer layer 706, an electron-relay layer 707, and a composite material layer 708 which is in contact with the reflective electrode 109, between the transparent electrode 105 and the reflective electrode 109.

It is preferable to provide the composite material layer 708 which is in contact with the reflective electrode 109, because, in this case, damage to the light-emitting region 107 caused particularly when the reflective electrode 109 is formed by a sputtering method can be reduced. The composite material layer 708 can be formed using the above-described composite material in which a substance having an acceptor property is contained with an organic compound having a high hole-transport property.

Further, with the electron-injection buffer layer 706, an injection barrier between the composite material layer 708 and the electron-transport layer 704 can be reduced; thus, electrons generated in the composite material layer 708 can be easily injected into the electron-transport layer 704.

A substance having a high electron-injection property, such as an alkali metal, an alkaline earth metal, a rare earth metal, a compound of the above metal (e.g., an alkali metal compound (e.g., an oxide such as lithium oxide, a halide, or a carbonate such as lithium carbonate or cesium carbonate), an alkaline earth metal compound (e.g., an oxide, a halide, or a carbonate), or a rare earth metal compound (e.g., an oxide, a halide, or a carbonate), can be used for the electron-injection buffer layer 706.

Further, in the case where the electron-injection buffer layer 706 includes a substance having a high electron-transport property and a substance having a donor property, the substance having a donor property is preferably added so that the mass ratio thereof to the substance having a high electron-transport property is greater than or equal to 0.001 and less than or equal to 0.1. Note that as the substance having a donor property, an organic compound such as tetrathianaphthacene (abbreviation: TTN), nickelocene, or decamethylnickelocene can be used as well as an alkali metal, an alkaline earth metal, a rare earth metal, and a compound of the above metal (e.g., an alkali metal compound (including an oxide such as lithium oxide, a halide, and a carbonate such as lithium carbonate or cesium carbonate), an alkaline earth metal compound (including an oxide, a halide, and a carbonate), and a rare earth metal compound (including an oxide, a halide, and a carbonate)). Note also that as the substance having a high electron-transport property, a material similar to the material for the electron-transport layer 704 described above can be used.

Furthermore, it is preferable that the electron-relay layer 707 be formed between the electron-injection buffer layer 706 and the composite material layer 708. The electron-relay layer 707 is not necessarily provided; however, with the electron-relay layer 707 having a high electron-transport property, electrons can be rapidly transported to the electron-injection buffer layer 706.

The structure in which the electron-relay layer 707 is interposed between the composite material layer 708 and the electron-injection buffer layer 706 is a structure in which the substance having an acceptor property included in the composite material layer 708 and the substance having a donor property included in the electron-injection buffer layer 706 are less likely to interact with each other, and thus their functions hardly interfere with each other. Accordingly, an increase in driving voltage can be suppressed.

The electron-relay layer 707 includes a substance having a high electron-transport property and is formed so that the LUMO level of the substance having a high electron-transport property is located between the LUMO level of the substance having an acceptor property included in the composite material layer 708 and the LUMO level of the substance having a high electron-transport property included in the electron-transport layer 704. In the case where the electron-relay layer 707 includes a donor substance, the donor level of the donor substance is controlled so as to be located between the LUMO level of the substance having an acceptor property in the composite material layer 708 and the LUMO level of the substance having a high electron-transport property included in the electron-transport layer 704. As a specific value of the energy level, the LUMO level of the substance having a high electron-transport property included in the electron-relay layer 707 is preferably higher than or equal to −5.0 eV, more preferably higher than or equal to −5.0 eV and lower than or equal to −3.0 eV.

As the substance having a high electron-transport property included in the electron-relay layer 707, a phthalocyanine-based material or a metal complex having a metal-oxygen bond and an aromatic ligand is preferably used.

As the phthalocyanine-based material included in the electron-relay layer 707, any of the following is preferably used: CuPc, SnPc (phthalocyanine tin(III) complex), ZnPc (phthalocyanine zinc complex), CoPc (cobalt(II) phthalocyanine, β-form), FePc (phthalocyanine iron), and PhO-VOPc (vanadyl 2,9,16,23-tetraphenoxy-29H,31H-phthalocyanine).

A metal complex having a metal-oxygen double bond is preferably used as the metal complex having a metal-oxygen bond and an aromatic ligand, which is included in the electron-relay layer 707. The metal-oxygen double bond has an acceptor property (a property of easily accepting electrons); accordingly, electrons can be transferred (donated and accepted) more easily. Further, the metal complex having a metal-oxygen double bond is considered stable. Thus, the use of the metal complex having the metal-oxygen double bond enables the light-emitting element to be driven more stably at low voltage.

As the metal complex having a metal-oxygen bond and an aromatic ligand, a phthalocyanine-based material is preferable. Specifically, any of VOPc (vanadyl phthalocyanine), SnOPc (phthalocyanine tin(IV) oxide complex), and TiOPc (phthalocyanine titanium oxide complex) is preferable because a metal-oxygen double bond is likely to act on another molecule in terms of a molecular structure and an acceptor property is high.

Note that as the phthalocyanine-based materials described above, a phthalocyanine-based material having a phenoxy group is preferable. Specifically, a phthalocyanine derivative having a phenoxy group, such as PhO-VOPc, is preferable. The phthalocyanine derivative having a phenoxy group is soluble in a solvent and therefore has the advantage of being easy to handle during formation of a light-emitting element and the advantage of facilitating maintenance of an apparatus used for fanning a film.

The electron-relay layer 707 may further include a substance having a donor property. As the substance having a donor property, an organic compound such as tetrathianaphthacene (abbreviation: TTN), nickelocene, or decamethylnickelocene can be used as well as an alkali metal, an alkaline earth metal, a rare earth metal, and a compound of the above metal (e.g., an alkali metal compound (including an oxide such as lithium oxide, a halide, and a carbonate such as lithium carbonate or cesium carbonate), an alkaline earth metal compound (including an oxide, a halide, and a carbonate), and a rare earth metal compound (including an oxide, a halide, and a carbonate)). When such a substance having a donor property is included in the electron-relay layer 707, electrons can be transferred easily and the light-emitting element can be driven at lower voltage.

In the case where the substance having a donor property is included in the electron-relay layer 707, other than the materials described above as the substance having a high electron-transport property, a substance having a LUMO level higher than the acceptor level of the substance having an acceptor property included in the composite material layer 708 can be used. Specifically, it is preferable to use a substance having a LUMO level higher than or equal to −5.0 eV, preferably higher than or equal to −5.0 eV and lower than or equal to −3.0 eV. Examples of such a substance are perylene derivatives, nitrogen-containing condensed aromatic compounds, and the like. Note that a nitrogen-containing condensed aromatic compound is preferably used for a material used for formation of the electron-relay layer 707 because of its stability.

Specific examples of the perylene derivative are 3,4,9,10-perylenetetracarboxylic dianhydride (abbreviation: PTCDA), bisbenzimidazo[2,1-a:2',1'-a]anthra[2,1,9-def:6,5,10-d'e'f']diisoquinoline-10,21-dione (abbreviation: FTCBI), N,N'-dioctyl-3,4,9,10-perylenetetracarboxylic diimide (abbreviation: PTCDI-C8H), N,N'-dihexyl-3,4,9,10-perylenetetracarboxylic diimide (abbreviation: Hex PTC), and the like.

Specific examples of the nitrogen-containing condensed aromatic compound are pirazino[2,3-f][1,10]phenanthroline-2,3-dicarbonitrile (abbreviation: PPDN), 2,3,6,7,10,11-hexacyano-1,4,5,8,9,12-hexaazatriphenylene (abbreviation: HAT(CN)$_6$), 2,3-diphenylpyrido[2,3-b]pyrazine (abbreviation: 2PYPR), 2,3-bis(4-fluorophenyl)pyrido[2,3-b]pyrazine (abbreviation: F2PYPR), and the like.

Besides, 7,7,8,8-tetracyanoquinodimethane (abbreviation: TCNQ), 1,4,5,8-naphthalenetetracarboxylic dianhydride (abbreviation: NTCDA), perfluoropentacene, copper hexadecafluorophthalocyanine (abbreviation: F$_{16}$CuPc), N,N'-bis(2,2,3,3,4,4,5,5,6,6,7,7,8,8-pentadecafluorooctyl)-1,4,5,8-naphthalenetetracarboxylic diimide (abbreviation: NTCDI-C8F), 3',4'-dibutyl-5,5''-bis(dicyanomethylene)-5,5''-dihydro-2,2':5'',2''-terthiophene (abbreviation: DCMT), a methanofullerene (e.g., [6,6]-phenyl C$_{61}$ butyric acid methyl ester), or the like can be used.

Note that in the case where the substance having a donor property is included in the electron-relay layer 707, the electron-relay layer 707 can be formed by a method such as co-evaporation of the substance having a high electron-transport property and the substance having a donor property.

The hole-injection layer 701, the hole-transport layer 702, the light-emitting layer 703, and the electron-transport layer 704 can be formed using any of the above-described materials.

Then, the reflective electrode 109 is formed over the light-emitting region 107.

For the reflective electrode 109 which functions as the cathode, any of metals, alloys, electrically conductive compounds, mixtures thereof, and the like which has a low work function (preferably 3.8 eV or less) is preferably used. Specifically, in addition to elements that belong to Group 1 or Group 2 in the periodic table, that is, alkali metals such as lithium and cesium, alkaline earth metals such as calcium and strontium, magnesium, alloys thereof (e.g., Mg—Ag and Al—Li), rare earth metals such as europium and ytterbium, and alloys thereof, aluminum, silver, or the like can be used.

The reflective electrode 109 which is provided on an opposite side of the light extraction direction has a function of reflecting light. As a reflective material, a metal material such as aluminum, gold, platinum, silver, nickel, tungsten, chromium, molybdenum, iron, cobalt, copper, or palladium can be used. In addition, any of the following can be used: alloys containing aluminum (aluminum alloys) such as an alloy of aluminum and titanium, an alloy of aluminum and nickel, and an alloy of aluminum and neodymium; and an alloy containing silver such as an alloy of silver and copper. An alloy of silver and copper is preferable because of its high heat resistance. Further, a metal film or a metal oxide film is stacked on an aluminum alloy film, whereby oxidation of the aluminum alloy film can be prevented. As examples of a material for the metal film or the metal oxide film, titanium, titanium oxide, and the like are given. Further, the above materials are preferable because they are present in large amounts in the earth's crust and inexpensive to achieve a reduction in manufacturing cost of a light-emitting element.

When a composite material described above in which an organic compound and an electron donor (donor) is used for a layer included in the light-emitting region 107 which is formed in contact with the reflective electrode 109, a variety of conductive materials such as Al, Ag, ITO, and indium tin oxide containing silicon or silicon oxide can be used regardless of work function.

When the reflective electrode 109 is formed, a vacuum evaporation method or a sputtering method can be used. When a silver paste or the like is used, a coating method, an inkjet method, or the like can be used.

In the above manner, the light-emitting device of this embodiment can be manufactured.

By provision of the solid-state light-emitting element of this embodiment to an optical element according to one embodiment of the present invention, a light-emitting device with high light extraction efficiency can be provided.

This embodiment can be combined with any of the other embodiments as appropriate.

(Embodiment 4)

In this embodiment, a light-emitting device according to one embodiment of the present invention which can be used mainly for a lighting device is described with reference to FIGS. 8A to 8C. FIG. 8A is a top view illustrating a light-emitting device 600, and FIGS. 8B and 8C are cross-sectional views taken along a line A-B in FIG. 8A.

In the light-emitting device 600 illustrated in FIG. 8A, one electrode of a light-emitting element is electrically connected to a first terminal 603, and the other electrode of the light-emitting element is electrically connected to a second terminal 604.

The light-emitting device 600 illustrated in FIG. 8B includes, over a first substrate 601, a light-emitting element 608 including a first electrode 605, an EL layer 606, and a second electrode 607. The light-emitting element 608 extracts light from the first substrate side and thus uses an optical element according to one embodiment of the present invention for the first substrate 601.

As illustrated in FIG. 8B, the first terminal 603 is electrically connected to an auxiliary wiring 610 and the first electrode 605. A second terminal 604 is electrically connected to a second electrode 607. An insulating layer 609 is formed over an edge portion of the first electrode 605 and a portion of the first electrode 605, which is stacked over an auxiliary wiring 610. Note that although the first electrode 605 is formed over the auxiliary wiring 610 in FIG. 8B, the auxiliary wiring 610 may be formed over the first electrode 605.

The first substrate 601 and a second substrate 602 are bonded to each other with a sealant 612. A desiccant 611 is included between the first substrate 601 and the second substrate 602.

The light-emitting device illustrated in FIG. 8B has a so-called bottom emission structure in which light emitted by the light-emitting element 608 is extracted from the first electrode 605 side of the light-emitting element 608; however, the present invention is not limited thereto, and a light-emitting device having a top emission structure in which light is extracted from the second electrode 607 side of the light-emitting element 608 can also be formed.

For a light-emitting device having a top emission structure, a structure illustrated in FIG. 8C can be employed.

The light-emitting device 600 having a top emission structure includes, over the first substrate 601, the light-emitting element 608 including the first electrode 605, the EL layer 606, and the second electrode 607. The light-emitting device 600 having a top emission structure extracts light from the second substrate 602 side, which is opposite to the first substrate 601, and thus uses an optical element according to one embodiment of the present invention for the second substrate 602.

As illustrated in FIG. 8C, the first terminal 603 is electrically connected to the first electrode 605, and the second terminal 604 is electrically connected to the second electrode 607. Further, the insulating layer 609 is formed over the edge portion of the first electrode 605. The auxiliary wiring 610 is formed over the second electrode 607.

The first substrate 601 and the second substrate 602 are bonded to each other with the sealant 612. A space between the first substrate 601 and the second substrate 602 is filled with a filler 613. The space is filled with the filler 613 in order to prevent light from the light-emitting element from entering the air before the optical element.

A gas barrier layer may be provided between the light-emitting element 608 and the filler 613. Provision of the gas barrier layer prevents impurities such as moisture from entering the light-emitting element. The filler 613 may contain a desiccant for removal of moisture that enters the light-emitting-element.

Note that although the light-emitting device 600 illustrated in FIG. 8A is octagonal, one embodiment of the present invention is not limited thereto. The light-emitting device 600 may have other polygonal shapes or a shape with a curve. In particular, as the shape of the light-emitting device 600, a triangular shape, a rectangular shape, a regular hexagonal shape, or the like is preferable. The reason for this is that the plurality of light-emitting devices 600 can be provided without a redundant space in a limited area.

Accordingly, a light-emitting device which is one embodiment of the present invention can be obtained. Note that a light-emitting device according to one embodiment of the present invention extracts light, which is emitted by a solid-state light-emitting element, to the air through the optical element whose refractive index continuously decreases from the solid-state light-emitting element toward the air as a result of injection of bubbles; accordingly, in the light-emitting device according to one embodiment of the present invention, light reflection is suppressed and high light extraction efficiency is achieved.

Further, an uneven structure may be provided at a plane (light emission plane) from which light is extracted. Without using a material with a high refractive index, reflection is further suppressed by provision of such a structure and the light-emitting device can have high light extraction efficiency.

Thus, a light-emitting device with high light extraction efficiency can be provided with the use of an inexpensive material with a low refractive index.

Note that the structure described in this embodiment can be combined as appropriate with any of the structures described in the other embodiments.

(Embodiment 5)

Figure 9:
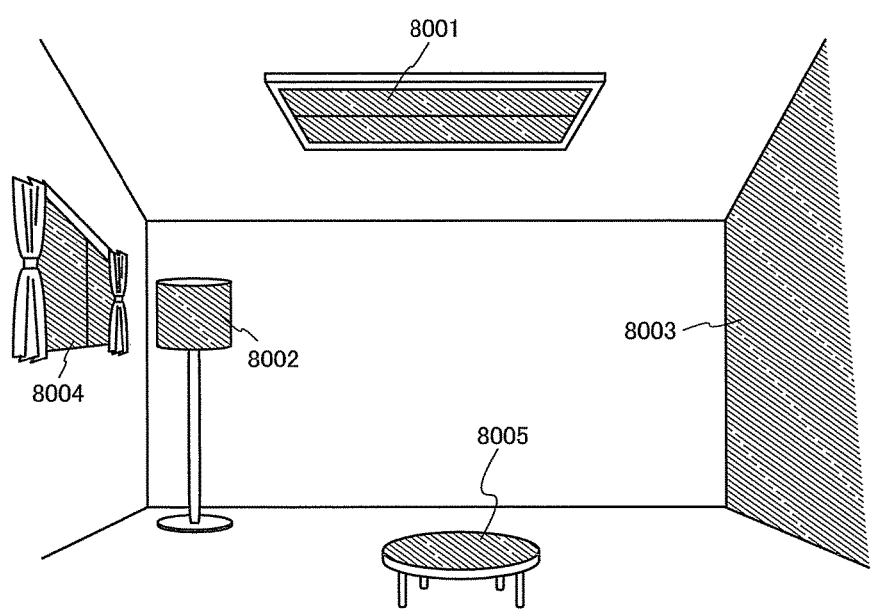
FIG. 9 illustrates lighting devices according to one embodiment of the present invention.

In this embodiment, an example of a lighting device which is one embodiment of the present invention is described using FIG. 9.

Note that the lighting device described in this embodiment can be formed by application of the light-emitting device which is one embodiment of the present invention and is described in the above embodiment.

FIG. 9 illustrates an example in which the lighting device which is one embodiment of the present invention is used as an indoor lighting device 8001. Note that since the area of the lighting device can be increased, a lighting device having a large area can also be formed. In addition, a lighting device 8002 in which a light-emitting region has a curved surface can also be obtained with the use of a housing with a curved surface. A light-emitting element included in the lighting device described in this, embodiment is in a thin film form, which allows the housing to be designed more freely. Therefore, the lighting device can be elaborately designed in a variety of ways. Further, a wall of the room may be equipped with a large-sized lighting device 8003.

In addition, when being entirely formed using a light-transmitting material, a lighting device which is one embodiment of the present invention can be used as a window glass 8004.

Furthermore, a lighting device which is one embodiment of the present invention can be used as a table 8005 when the light-emitting device in the lighting device is used as a surface of the table. Note that a lighting device which is one embodiment of the present invention can be used as furniture when the light-emitting device in the lighting device is used as part of the furniture.

In this manner, a lighting device which is one embodiment of the present invention can be used for a variety of purposes. The lighting device described in this embodiment includes the light-emitting device which is one embodiment of the present invention and is described in the above embodiment, and thus is an efficient lighting device with improved light extraction efficiency.

Note that the structure described in this embodiment can be combined as appropriate with any of the structures described in the other embodiments.

This application is based on Japanese Patent Application serial no. 2011-029181 filed with Japan Patent Office on Feb. 14, 2011, the entire contents of which are hereby incorporated by reference.

What is claimed is:

1. A light-emitting device comprising:
an organic EL element over a substrate;
an optical element;
a sealant configured to bond the substrate and the optical element; a terminal electrically connected to the organic EL element between the substrate and the sealant; and
a filler to fill a space formed by the substrate, the optical element, and the sealant,
wherein the optical element includes an organic resin and bubbles each having a diameter of greater than or equal to 10 nm and less than or equal to 10 μm,
wherein the bubbles are distributed to have a number density increasing from a first plane of the optical element toward a second plane of the optical element so that a refractive index of the optical element decreases from the first plane toward the second plane,
wherein the organic EL element is a planar light source,
wherein at least one of the first plane and the second plane includes an uneven structure,
wherein the uneven structure is a hemispherical structure, and
wherein a refractive index of the hemispherical structure concentrically decreases from a center of a hemisphere toward an outside.

2. The light-emitting device according to claim 1, wherein the second plane has a refractive index greater than 1.0 and less than 1.1.

3. A lighting device comprising the light-emitting device according to claim 1.

4. A light-emitting device comprising:
an organic EL element over a substrate;
an optical element;
a sealant configured to bond the substrate and the optical element; a terminal electrically connected to the organic EL element between the substrate and the sealant; and
a filler to fill a space formed by the substrate, the optical element, and the sealant,
wherein the optical element includes a material and bubbles each having a diameter of greater than or equal to 10 nm and less than or equal to 10 μm,
wherein the material is one of glass, indium oxide, indium tin oxide, indium zinc oxide, zinc oxide, zinc oxide to which gallium is added, and graphene,
wherein the bubbles are distributed to have a number density increasing from a first plane of the optical element toward a second plane of the optical element so that a refractive index of the optical element decreases from the first plane toward the second plane,
wherein the organic EL element is a planar light source,
wherein at least one of the first plane and the second plane includes an uneven structure,
wherein the uneven structure is a hemispherical structure, and
wherein a refractive index of the hemispherical structure concentrically decreases from a center of a hemisphere toward an outside.

5. The light-emitting device according to claim 4, wherein the second plane has a refractive index greater than 1.0 and less than 1.1.

6. A lighting device comprising the light-emitting device according to claim 4.

7. The light-emitting device according to claim 1,
wherein the organic EL element includes a transparent electrode in contact with the optical element, a light-emitting region over the transparent electrode, and a reflective electrode over the light-emitting region.

8. The light-emitting device according to claim 4,
wherein the organic EL element includes a transparent electrode in contact with the optical element, a light-emitting region over the transparent electrode, and a reflective electrode over the light-emitting region.

9. The light-emitting device according to claim 1,
wherein a diameter of the uneven structure is 0.1 mm to 10 mm.

10. The light-emitting device according to claim 4,
wherein a diameter of the uneven structure is 0.1 mm to 10 mm.

11. The light-emitting device according to claim 1,
wherein a first uneven structure is provided for the first plane and a second uneven structure is provided for the second plane,
wherein a distance from a valley to a peak of the first uneven structure is 0.1 μm to 100 μm and a distance between adjacent peaks of the first uneven structure is 1 μm to 100 μm, and
wherein a diameter of the second uneven structure is 0.1 mm to 10 mm.

12. The light-emitting device according to claim 1,
wherein the organic resin is one of a polyester resin, a polyacrylonitrile resin, a polyimide resin, a polymethyl methacrylate resin, a polycarbonate resin, a polyether sulfonate resin, a polyamide resin, a cycloolefin resin, a polystyrene resin, and a polyvinyl chloride resin.

13. The light-emitting device according to claim 4,
wherein a first uneven structure is provided for the first plane and a second uneven structure is provided for the second plane,
wherein a distance from a valley to a peak of the first uneven structure is 0.1 μm to 100 μm and a distance between adjacent peaks of the first uneven structure is 1 μm to 100 μm, and
wherein a diameter of the second uneven structure is 0.1 mm to 10 mm.

14. The light-emitting device according to claim 1,
wherein the first plane of the optical element is closer to the organic EL element than the second plane of the optical element.

15. The light-emitting device according to claim 4,
wherein the first plane of the optical element is closer to the organic EL element than the second plane of the optical element.

16. A light-emitting device comprising:
an optical element;
an organic EL element over the optical element;
a substrate;
a sealant configured to bond the substrate and the optical element; a terminal electrically connected to the organic EL element between the optical element and the sealant; and
a filler to fill a space formed by the substrate, the optical element, and the sealant,
wherein the optical element includes an organic resin and bubbles each having a diameter of greater than or equal to 10 nm and less than or equal to 10 μm,
wherein the bubbles are distributed to have a number density increasing from a first plane of the optical element toward a second plane of the optical element so that a refractive index of the optical element decreases from the first plane toward the second plane,
wherein the organic EL element is a planar light source,
wherein at least one of the first plane and the second plane includes an uneven structure,
wherein the uneven structure is a hemispherical structure, and
wherein a refractive index of the hemispherical structure concentrically decreases from a center of a hemisphere toward an outside.

17. The light-emitting device according to claim 16, wherein the second plane has a refractive index greater than 1.0 and less than 1.1.

18. A lighting device comprising the light-emitting device according to claim 16.

19. The light-emitting device according to claim 16,
wherein the organic EL element includes a transparent electrode in contact with the optical element, a light-emitting region over the transparent electrode, and a reflective electrode over the light-emitting region.

20. The light-emitting device according to claim 16,
wherein a first uneven structure is provided for the first plane and a second uneven structure is provided for the second plane,
wherein a distance from a valley to a peak of the first uneven structure is 0.1 μm to 100 μm and a distance between adjacent peaks of the first uneven structure is 1 μm to 100 μm, and
wherein a diameter of the second uneven structure is 0.1 mm to 10 mm.

21. The light-emitting device according to claim 16,
wherein the organic resin is one of a polyester resin, a polyacrylonitrile resin, a polyimide resin, a polymethyl methacrylate resin, a polycarbonate resin, a polyether sulfonate resin, a polyamide resin, a cycloolefin resin, a polystyrene resin, and a polyvinyl chloride resin.

22. The light-emitting device according to claim 16,
wherein the first plane of the optical element is in contact with the organic EL element.

23. A light-emitting device comprising:
an optical element;
an organic EL element over the optical element;
a substrate;
a sealant configured to bond the substrate and the optical element; a terminal electrically connected to the organic EL element between the optical element and the sealant; and
a filler to fill a space formed by the substrate, the optical element, and the sealant,
wherein the optical element includes a material and bubbles each having a diameter of greater than or equal to 10 nm and less than or equal to 10 μm,
wherein the material is one of glass, indium oxide, indium tin oxide, indium zinc oxide, zinc oxide, zinc oxide to which gallium is added, and graphene,
wherein the bubbles are distributed to have a number density increasing from a first plane of the optical element toward a second plane of the optical element so that a refractive index of the optical element decreases from the first plane toward the second plane,
wherein the organic EL element is a planar light source,
wherein at least one of the first plane and the second plane includes an uneven structure,
wherein the uneven structure is a hemispherical structure, and
wherein a refractive index of the hemispherical structure concentrically decreases from a center of a hemisphere toward an outside.

24. The light-emitting device according to claim 23, wherein the second plane has a refractive index greater than 1.0 and less than 1.1.

25. A lighting device comprising the light-emitting device according to claim 23.

26. The light-emitting device according to claim 23,
wherein the organic EL element includes a transparent electrode in contact with the optical element, a light-emitting region over the transparent electrode, and a reflective electrode over the light-emitting region.

27. The light-emitting device according to claim 23,
wherein a first uneven structure is provided for the first plane and a second uneven structure is provided for the second plane,
wherein a distance from a valley to a peak of the first uneven structure is 0.1 μm to 100 μm and a distance between adjacent peaks of the first uneven structure is 1 μm to 100 μm, and
wherein a diameter of the second uneven structure is 0.1 mm to 10 mm.

28. The light-emitting device according to claim 23,
wherein the first plane of the optical element is in contact with the organic EL element.

29. The light-emitting device according to claim 1,
wherein the filler contains a desiccant.

30. The light-emitting device according to claim 4,
wherein the filler contains a desiccant.

31. The light-emitting device according to claim 16,
wherein the filler contains a desiccant.

32. The light-emitting device according to claim 23,
wherein the filler contains a desiccant.

33. The light-emitting device according to claim 16, further comprising a desiccant between the optical element and the substrate.

34. The light-emitting device according to claim 23, further comprising a desiccant between the optical element and the substrate.

35. The light-emitting device according to claim 1,
wherein the organic EL element and the optical element are a pair.

36. The light-emitting device according to claim 1,
wherein a first part of the organic EL element extends a first direction from a center portion of the optical element to near a first end portion of the optical element,
wherein a second part of the organic EL element extends a second direction from the center portion of the optical element to near a second end portion of the optical element,
wherein the first direction is orthogonal to the second direction.

37. The light-emitting device according to claim 4,
wherein the organic EL element and the optical element are a pair.

38. The light-emitting device according to claim 4,
wherein a first part of the organic EL element extends a first direction from a center portion of the optical element to near a first end portion of the optical element,
wherein a second part of the organic EL element extends a second direction from the center portion of the optical element to near a second end portion of the optical element,
wherein the first direction is orthogonal to the second direction.

39. The light-emitting device according to claim 16,
wherein the organic EL element and the optical element are a pair.

40. The light-emitting device according to claim 16,
wherein a first part of the organic EL element extends a first direction from a center portion of the optical element to near a first end portion of the optical element,
wherein a second part of the organic EL element extends a second direction from the center portion of the optical element to near a second end portion of the optical element,
wherein the first direction is orthogonal to the second direction.

41. The light-emitting device according to claim 23,
wherein the organic EL element and the optical element are a pair.

42. The light-emitting device according to claim 23,
wherein a first part of the organic EL element extends a first direction from a center portion of the optical element to near a first end portion of the optical element,
wherein a second part of the organic EL element extends a second direction from the center portion of the optical element to near a second end portion of the optical element,
wherein the first direction is orthogonal to the second direction.

43. The light-emitting device according to claim 1,
wherein the bubbles each having a diameter of greater than or equal to 10 nm and less than 100 nm.

44. The light-emitting device according to claim 4,
wherein the bubbles each having a diameter of greater than or equal to 10 nm and less than 100 nm.

45. The light-emitting device according to claim 16,
wherein the bubbles each having a diameter of greater than or equal to 10 nm and less than 100 nm.

46. The light-emitting device according to claim 23,
wherein the bubbles each having a diameter of greater than or equal to 10 nm and less than 100 nm.

* * * * *